(12) United States Patent
Watanabe et al.

(10) Patent No.: US 8,016,537 B2
(45) Date of Patent: Sep. 13, 2011

(54) INLINE-TYPE WAFER CONVEYANCE DEVICE

(75) Inventors: Naoki Watanabe, Kawasaki (JP); Einstein Noel Abarra, Hachioji (JP); David Djulianto Djayaprawira, Inagi (JP); Yasumi Kurematsu, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/750,955

(22) Filed: Mar. 31, 2010

(65) Prior Publication Data

US 2010/0215460 A1   Aug. 26, 2010

Related U.S. Application Data

(63) Continuation of application No. PCT/JP2007/071817, filed on Nov. 9, 2007.

(51) Int. Cl.
*H01L 21/677* (2006.01)
(52) U.S. Cl. .................................... 414/217; 414/937
(58) Field of Classification Search .................. 414/217, 414/935, 939, 411, 937
See application file for complete search history.

(56) References Cited

U.S. PATENT DOCUMENTS

| | | | | |
|---|---|---|---|---|
| 4,825,808 A | * | 5/1989 | Takahashi et al. | 118/719 |
| 4,917,556 A | | 4/1990 | Stark et al. | 414/217 |
| 5,417,537 A | * | 5/1995 | Miller | 414/217 |
| 5,942,013 A | * | 8/1999 | Akimoto | 29/25.01 |
| 6,264,748 B1 | * | 7/2001 | Kuriki et al. | 118/719 |
| 7,182,122 B2 | * | 2/2007 | Koguchi et al. | 165/48.1 |
| 7,210,246 B2 | | 5/2007 | van der Meulen | 34/467 |
| 7,282,460 B2 | * | 10/2007 | Jang | 438/800 |
| 2006/0102078 A1 | | 5/2006 | Fairbairn et al. | 118/719 |
| 2007/0231109 A1 | * | 10/2007 | Pak et al. | 414/217 |
| 2008/0145192 A1 | * | 6/2008 | van der Meulen et al. | 414/217 |
| 2009/0134010 A1 | | 5/2009 | Shibamoto et al. | 204/192.1 |

FOREIGN PATENT DOCUMENTS

| | | |
|---|---|---|
| JP | 1-500072 | 1/1989 |
| JP | 9-008094 | 1/1997 |
| JP | 2007-005435 | 1/2007 |

* cited by examiner

*Primary Examiner* — Charles A Fox
(74) *Attorney, Agent, or Firm* — Fitzpatrick, Cella, Harper & Scinto

(57) ABSTRACT

A structure is provided in which a load lock chamber (51) for carrying in an unprocessed wafer from outside and carrying out a processed wafer to outside, a first end conveyance chamber (54a) to be connected to the load lock chamber, at least one intermediate conveyance chamber (54b), a plurality of sets of a pair of process modules (52a, 52b) provided adjacent to each other and capable of independent processing, and a second end conveyance chamber (54c) disposed at the end part on the opposite side of the load lock chamber are connected in series. Each set of process modules (52a, 52b, 52c and 52d) is arranged one by one between the first end conveyance chamber and the intermediate conveyance chamber, between the intermediate conveyance chambers, and between the intermediate conveyance chamber and the second end conveyance chamber, respectively.

15 Claims, 20 Drawing Sheets

INLINE-TYPE WAFER CONVEYANCE DEVICE

CROSS-REFERENCES TO RELATED APPLICATIONS

This application is a continuation application of International Application No. PCT/JP2007/071817, filed on Nov. 9, 2007, the entire contents of which are incorporated by reference herein.

TECHNICAL FIELD

The present invention relates to a semiconductor manufacturing device and a manufacturing method and, in more detail, relates to an inline-type wafer conveyance device having a compact structure.

BACKGROUND ART

There are several types of conventional semiconductor wafer conveyance devices and each of them has a big drawback. A conventional cluster-type wafer conveyance device has a structure in which a plurality of process modules is arranged radially around a robot chamber located in the center. Such a cluster-type wafer conveyance device requires a large footprint for installation. Further, each time processing in each process module is completed, a wafer is temporarily placed in a buffer part etc. and waits for the next processing, and therefore, the processing speed of the device as a whole is relatively slow. Further, in most cases, the maximum number of process modules in a cluster-type wafer conveyance device is normally limited to five or six for design reasons.

An inline-type wafer conveyance device has a higher processing speed compared to that of a cluster-type device. However, because of its rectilinear structure, it is hard to adapt the inline-type wafer conveyance device to the structure of a most recent semiconductor manufacturing facility. Further, in a conventional inline-type wafer conveyance device, when a wafer is conveyed in a vacuum environment in a semiconductor manufacturing process, there may be a case where particles occur at an unacceptable level due to the friction between the components of the waver conveyance device.

A plan view of a conventional inline-type wafer conveyance device is shown in FIG. 1 (for example, refer to patent document 1). In a wafer conveyance device 10, each of process modules 13a to 13g is arranged adjacent to each other and connected in an inline manner. Each process module is separated by a gate valve (not shown schematically). A wafer is conveyed from a load chamber 14 to the first process module 13a by a robot 12 within a robot chamber 11 and is processed sequentially in each process module. The processed wafer is conveyed from the last process module 13g to an unload chamber 15 by the robot 12. Extra robots to convey a wafer or robot chambers are not necessary, and therefore, a footprint required in the wafer conveyance device 10 is comparatively small.

A partial section view of the inline-type wafer conveyance device 10 shown in FIG. 1 is shown in FIG. 2. A wafer 21 is mounted on a carrier 23 and conveyed from a certain process module to the next process module. In each process module, the wafer 21 is lifted from the carrier 23 by a lift base 26 and processed, and then is mounted on the carrier 23 again and conveyed to the next process module. The carrier 23 is moved by means of a transfer mechanism, such as a roller 25. When the wafer 21 is conveyed to the next neighboring process module, a gate valve 24 is opened and thus the neighboring process modules are brought into a state where they are not hermetically sealed from each other. The wafer 21 having been subjected to processing in a certain process module waits until the next process module becomes empty.

A plan view of another conventional inline-type wafer conveyance device 30 is shown in FIG. 3 (for example, refer to patent document 2). The wafer conveyance device 30 comprises two front opening unified pods (FOUP) 31a and 31b. For example, the FOUP 31a has two load chambers 32a and 32b each having a cassette for storing an unprocessed wafer and the FOUP 31b has two unload chambers 33a and 33b each having a cassette for storing a processed wafer. The wafer conveyance device 30 further comprises buffer chambers 36a to 36d for temporarily placing a wafer during its conveyance. At the time of processing, a wafer is conveyed from a cassette within the load chamber 32a or 32b to the first buffer chamber 36a by a robot 35a within a robot chamber 34a. As shown schematically, the wafer conveyance device 30 comprises robot chambers 38a to 38c between the buffer chambers. Between each buffer chamber and its neighboring robot chamber, and between each robot chamber and its neighboring process module, a gate valve 39 is provided as shown schematically. A wafer once placed in the buffer chamber 36a is conveyed to a first process module 37a by a robot within the robot chamber 38a and processed therein. Subsequently, the wafer is conveyed to a second process module 37b again by the robot within the robot chamber 38a and processed therein. The wafer having been subjected to the processing in the second process module 37b is placed in the second buffer chamber 36b by the robot within the robot chamber 38a. Further, the wafer is conveyed from the buffer chamber 36b to a third process module 37c by the robot within the second robot chamber 38b. After that, the wafer is similarly moved from the process module 37c to a process module 37f sequentially and processed therein. The wafer having been subjected to the processing in all of the process modules is once placed in the buffer chamber 36d and then stored in the cassette within the unload chamber 33a or 33b of the FOUP 31b by a robot 35b within a robot chamber 34b. The wafer conveyance device 30 has an advantage that the number of the process modules can be increased flexibly as needed.

A plan view of a conventional cluster-type wafer conveyance device is shown in FIG. 4 (for example, refer to patent document 3). A wafer conveyance device 40 comprises an inlet module 45a and an outlet module 45b through which a wafer 46 is carried in from and carried out to outside, conveyance chambers 42a and 42b for conveying a wafer to process modules 41b, 41c, 41f and 41g, and conveyance robots 43a and 43b provided within the conveyance chambers 42a and 42b. A main controller 47 is communicated with each process module controller P, the inlet module 45a and the outlet module 45b, and an operator control panel via a standard communication bus 48. The wafer 46 not processed yet within the inlet module 45a is once placed on an aligner 44 by the conveyance robot 43a within the conveyance chamber 42a and its orientation is adjusted on the aligner 44. Then, the wafer on the aligner 44 is conveyed to, for example, the process module 41b or 41c by the conveyance robot 43a or 43b and processed therein, and then returned onto the aligner 44 again. After such a task is repeated, the wafer having been subjected to the processing in the process modules 41b, 41c, 41f and 41g is returned to the outlet module 45b by the conveyance robot 43a.

[Patent document 1] United States Patent Application Publication No. 2006/0102078 Specification
[Patent document 2] U.S. Pat. No. 7,210,246 Specification

[Patent document 3] Japanese Publication of Patent Application No. HEI 1-500072

SUMMARY OF THE INVENTION

It is required, however, for the inline-type wafer conveyance device 10 shown in FIG. 1 and FIG. 2 to comprise the mobile carrier 23 capable of holding a wafer to be processed within the wafer conveyance device 10 and a transfer mechanism, such as the roller 25, for moving the carrier 23. In this case, a problem arises that the structure of the wafer conveyance device 10 becomes complicated and expensive. Further, the carrier 23 is moved on a transfer mechanism, such as the roller 25, and therefore, particles are likely generated due to friction between these components. Particles that stick to the wafer 21 conveyed within the wafer conveyance device 10, degrade the quality of a film formed on the wafer.

The conventional inline-type wafer conveyance device 30 shown in FIG. 3 requires the buffer chambers 36a to 36d for temporarily placing a wafer, such that the device becomes more complicated. Further, the footprint required by the wafer conveyance device 30 becomes larger due to these buffer chambers. Furthermore, if an attempt is made to realize the wafer conveyance device 30 without using the buffer chambers 36a to 36d, it becomes necessary to directly deliver, for example, a wafer having been subjected to the processing in the second process module 37b from the robot chamber 38a to the next robot chamber 38b. That is, it becomes necessary to deliver a wafer between the robots. If such a structure is employed, the precision and reliability of the operation of the wafer conveyance device 30 are degraded.

The conventional cluster-type wafer conveyance device 40 has a structure in which the process modules are arranged radially with the conveyance chambers 42a and 42b located in the center as a center, and therefore, a problem arises that its footprint is large. Further, with the cluster-type wafer conveyance device 40, it is necessary to once place a wafer on the aligner 44 before conveying the wafer to each process module. The necessity of such an aligner causes the footprint of the whole device to further increase. Then, each time processing is completed, the wafer needs to be placed on the aligner 44, and therefore, a complicated conveying task is required.

In order to solve the conventional problems described above, an object of the present invention is to realize an inline-type wafer conveyance device capable of suppressing the generation of particles, obviating a complicated conveyance mechanism, and having a simple configuration with a small footprint.

In order to achieve the above-mentioned object, an inline-type wafer conveyance device according to the present invention has a structure in which a load lock chamber for carrying in an unprocessed wafer from outside and carrying out a processed wafer to outside, a first end conveyance chamber connected to the load lock chamber, at least one intermediate conveyance chamber, a plurality of sets of a pair of process modules provided adjacent to each other and capable of independent processing, and a second end conveyance chamber disposed at the end part on the opposite side of the load lock chamber are connected in series. Each of the sets of process modules is arranged one by one between the first end conveyance chamber and the intermediate conveyance chamber, between the intermediate conveyance chambers, and between the intermediate conveyance chamber and the second end conveyance chamber.

The first end conveyance chamber, the intermediate conveyance chamber and the second end conveyance chamber may have a conveyance mechanism capable of simultaneously conveying at least two wafers.

It may also be possible to configure the first end conveyance chamber and the second end conveyance chamber so as to each have at least one conveyance mechanism and first and second side surfaces perpendicular to each other. It may also be possible to configure each of the intermediate conveyance chambers so as to have at least one conveyance mechanism, substantially a square plane shape, and four side surfaces. It may also be possible to configure each of the process modules so as to have at least first and second side surfaces perpendicular to each other.

In this case, the first and second side surfaces of the first end conveyance chamber are connected to the first side surface of one of the process modules constituting the first set of process modules and to the first side surface of the other process module, respectively. The first and second side surfaces of each intermediate conveyance chamber are connected to the second side surface of one of the process modules of the set of process modules located immediately ahead and to the second side surface of the other process module, respectively. Third and fourth side surfaces of each intermediate conveyance chamber are connected to the first side surface of one of the process modules of the set of process modules located immediately behind and to the first side surface of the other process module, respectively. The first and second side surfaces of the second end conveyance chamber are connected to the second side surface of one of the process modules of the set of process modules located immediately ahead and to the second side surface of the other process module, respectively.

It is possible to configure the conveyance chamber and the process module so as to have various plane shapes, such as a square and a circle, and the side surfaces configured as described above are not necessarily required. It is possible to configure a pair of process modules belonging to each set of process modules so as to be connected to one of neighboring conveyance chambers via one of two gate valves the directions of which are perpendicular to each other and to the other neighboring conveyance chamber via the other gate valve.

The first and second side surfaces of the first end conveyance chamber, the first to fourth side surfaces of the intermediate conveyance chamber, the first and second side surfaces of the second end conveyance chamber, and the first and second side surfaces of the process module may include a horizontal slit to let a wafer pass, respectively. Further, the process module may have a stage to place a wafer.

In the above-described structure in which the intermediate conveyance chamber has substantially a square plane shape, if the total number of the first end conveyance chamber, the intermediate conveyance chambers and the second end conveyance chamber is assumed to be m, the maximum number of the process modules n is expressed as n=2(m−1).

The load lock chamber, the first end conveyance chamber, the intermediate conveyance chamber, the process module and the second end conveyance chamber are connected via gate valves.

The load lock chamber may include a conveyance mechanism and first and second buffer chambers. In this case, the first end conveyance chamber is configured so as to have substantially a square plane shape and four side surfaces. The third and fourth side surfaces of the first end conveyance chamber are connected to the first and second buffer chambers, respectively. An unprocessed wafer is carried into one of the process modules connected to the first end conveyance chamber from the first buffer chamber by the conveyance mechanism of the first end conveyance chamber. A processed wafer is carried out to the second buffer chamber from the other process module connected to the first end conveyance chamber by the conveyance mechanism of the first end conveyance chamber. Even when the first end conveyance chamber has a circular plane shape or a plane shape other than a square, it is only required to connect the first end conveyance chamber to each of the first and second buffer chambers of the load lock chamber.

According to the present invention, an inline-type wafer conveyance device is realized, which is capable of suppressing the generation of particles, obviates a complicated conveyance mechanism, and has s small footprint.

| Reference Signs List | |
|---|---|
| 10 | wafer conveyance device |
| 11 | conveyance chamber |
| 12 | robot |
| 13a-13g | process module |
| 14 | load chamber |
| 15 | unload chamber |
| 21 | wafer |
| 23 | carrier |
| 24 | gate valve |
| 25 | roller |
| 26 | lift base |
| 30 | wafer conveyance device |
| 31a, 31b | FOUP |
| 32a, 32b | load chamber |
| 33a, 33b | process module |
| 34a, 34b | conveyance chamber |
| 35a, 35b | robot |
| 36a-36d | buffer chamber |
| 37a-37f | process module |
| 38a-38c | conveyance chamber |
| 39 | gate valve |
| 40 | wafer conveyance device |
| 41b, 41c, 41f, 41g | process module |
| 42a, 42b | conveyance chamber |
| 43a, 43b | conveyance robot |
| 44 | aligner |
| 45a | inlet module |
| 45b | outlet module |
| 46 | wafer |
| 47 | main controller |
| 48 | standard communication bus |
| 50 | wafer conveyance device |
| 51 | load lock chamber |
| 52a-52d | process module |
| 54a | first end conveyance chamber |
| 54b | intermediate conveyance chamber |
| 54c | second end conveyance chamber |
| 55a-55c | conveyance mechanism |
| 56a-56j | gate valve |
| 60 | wafer conveyance device |
| 61 | FOUP |
| 61a | load chamber |
| 61b | unload chamber |
| 62a-62d | process module |
| 64a | first end conveyance chamber |
| 64b-64d | intermediate conveyance chamber |
| 64e | second end conveyance chamber |
| 65a-65e | conveyance mechanism |
| 66 | gate valve |
| 70 | wafer conveyance device |
| 71 | load lock chamber |
| 71a | load chamber |
| 71b | unload chamber |
| 71c | conveyance mechanism |
| 71d, 72e | buffer chamber |
| 72a-72d | process module |
| 74a | first end conveyance chamber |
| 74b | intermediate conveyance chamber |
| 74c | second end conveyance chamber |
| 75a | conveyance mechanism |
| 80 | wafer conveyance device |
| 81 | FOUP |
| 81a | load chamber |
| 81b | unload chamber |
| 82a-82h | process module |

-continued

Reference Signs List

| | |
|---|---|
| 84a | first end conveyance chamber |
| 84b-84d | intermediate conveyance chamber |
| 84e | second end conveyance chamber |
| 87 | cathode electrode |
| 90 | wafer conveyance device |
| 91 | load lock chamber |
| 91d, 92e | buffer chamber |
| 91f | conveyance chamber |
| 92a | process module |
| 98 | space |
| 100, 110, 120, 130, 140, 150, 160, 170, 180, 190 | wafer conveyance device |
| 101a, 111a, 121a, 131a, 141a, 151a, 161a, 171a, 181a, 191a | load chamber |
| 101b, 111b, 121b, 131b, 141b, 151b, 161b, 171b, 181b, 191b | unload chamber |
| 102a-102d, 112a-112d, 122a-122f, 132a-132f, 142a-142f, 152a-152j, 162a-162j, 172a-172j, 182a-182j, 192a-192j | process module |
| 105a, 105b | arm |
| 107 | cathode electrode |
| 114a | first end conveyance chamber |
| 115a | first wafer holding means |
| 124d | second end conveyance chamber |
| 125a | conveyance mechanism |

BEST MODES FOR CARRYING OUT THE INVENTION

Figure 5:
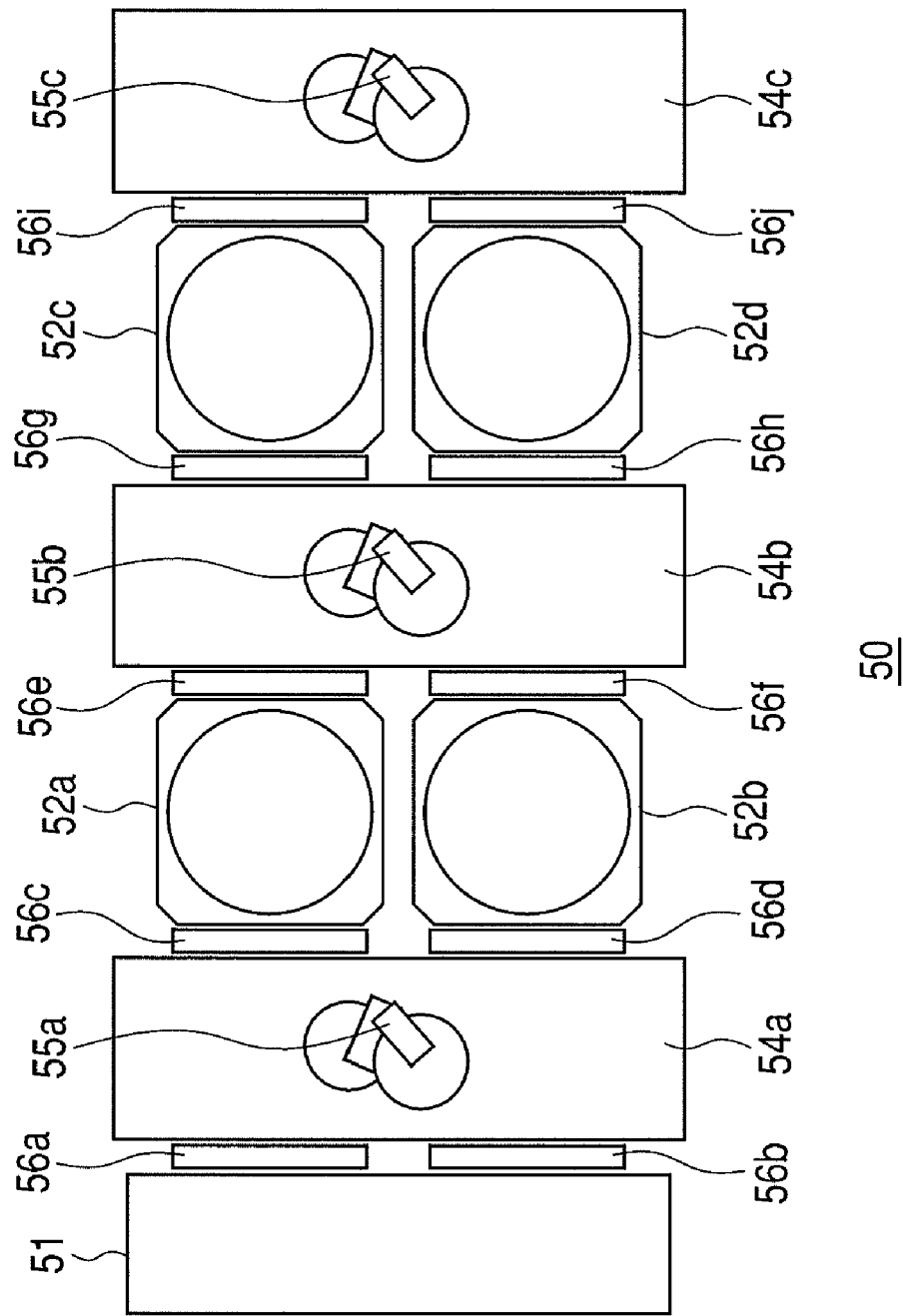
FIG. 5 is a plan view of an inline-type wafer conveyance device of the present invention.

FIG. 5 is a plan view of an inline-type wafer conveyance device of the present invention. A wafer conveyance device 50 comprises a load lock chamber 51, a first end conveyance chamber 54a, a set of a first process module 52a and a second process module 52b, an intermediate conveyance chamber 54b, a set of a third process module 52c and a fourth process module 52d, and a second end conveyance chamber 54c. The second end conveyance chamber 54c is disposed at the end part of the wafer conveyance device 50 on the opposite side of the load lock chamber 51 and no components are disposed beyond that.

The load lock chamber 51 is configured to carry in an unprocessed wafer from outside (atmosphere side) and to carry out a processed wafer to outside (atmosphere side) and includes an evacuation mechanism (not shown schematically). The load lock chamber 51 may include a plurality of load/unload chambers (not shown schematically) configured to carry in an unprocessed wafer from outside (atmosphere side) and to carry out a processed wafer to outside (atmosphere side). In this case, a wafer carried into the process module 52a using the first end conveyance chamber 55a from one load/unload chamber is sent to the same load/unload chamber or another load/unload chamber and carried out to outside when processing in each process module is returned to the load lock chamber 51.

The first end conveyance chamber 54a, the intermediate conveyance chamber 54b, and the second end conveyance chamber 54c include conveyance mechanisms 55a, 55b and 55c for conveying a wafer, respectively. The conveyance mechanisms 55a to 55c are each configured as a robot having an arm for moving a wafer.

The first end conveyance chamber 54a is connected to the load lock chamber 51 via gate valves 56a and 56b. Between the first end conveyance chamber 54a and the intermediate conveyance chamber 54b, a pair of the first process module 52a and the second process module 52b is arranged in parallel. The first process module 52a is connected to the first end conveyance chamber 54a and the intermediate conveyance chamber 54b, respectively, via gate valves 56c and 56e. The second process module 52b is connected to the first end conveyance chamber 54a and the intermediate conveyance chamber 54b, respectively, via gate valves 56d and 56f. The first process module 52a and the second process module 52b are configured so as to be capable of processing a wafer independently of each other.

The wafer conveyance device 50 shown in FIG. 5 comprises one intermediate conveyance chamber and two sets of process modules, however, the present embodiment is not limited to this structure. The wafer conveyance device 50 may comprise a plurality of intermediate conveyance chambers and three or more sets of process modules in accordance with a necessary number of processes. That is, between the first end conveyance chamber and the first intermediate conveyance chamber, between the intermediate conveyance chambers, and between the last intermediate conveyance chamber and the second end conveyance chamber, a pair of process modules capable of independent processing is arranged, respectively.

An unprocessed wafer is carried into a load chamber (not shown schematically) of the load lock chamber 51 from outside. The gate valves 56a and 56c are opened and the wafer is conveyed from the load lock chamber 51 to the first process module 52a by the conveyance mechanism 55a. The gate valves 56a and 56c that have been opened are closed and the wafer is processed within the first process module 52a. When the processing is completed, the gate valves 56e and 56g are opened and the wafer is conveyed from the first process module 52a to the third process module 52c by the conveyance mechanism 55b. The gate valves 56e and 56g that have been opened are closed and the wafer is processed within the third process module 52c.

The wafer conveyance device in the present embodiment is characterized by providing the second end conveyance chamber (54c in FIG. 5), which is connected to the opposite side of the load lock chamber 51 of the last set of process modules (the third process module 52c and the fourth process module 52d in FIG. 5). This second end conveyance chamber is located at the end part of the wafer conveyance device.

With this structure, it is made possible to convey a wafer processed in the first process module 52a and the third process module 52c as described above to the fourth process module 52d arranged in parallel with the third process module 52c by the conveyance mechanism 55c within the second end conveyance chamber 54c. In the operation, after gate valves 56i and 56j are opened, the conveyance mechanism 55c moves the wafer within the third process module 52c to the fourth process module 52d. The gate valves 56i and 56j that have been opened are closed and the wafer is processed within the fourth process module 52d. When the processing is completed, a gate valve 56h and the gate valve 56f are opened and the wafer is conveyed to the second process module 52b by the conveyance mechanism 55b. The gate valves 56h and 56f that have been opened are closed and the wafer is processed within the second process module 52b. When the processing is completed, the gate valves 56d and 56b are opened and the processed wafer is conveyed to the load lock chamber 51 by the conveyance mechanism 55a and carried out from the unload chamber (not shown schematically) to outside.

In the present embodiment, it is also possible to convey an unprocessed wafer from the load chamber (not shown schematically) to the process module 52a by the first end conveyance chamber 54a while conveying a wafer having been subjected to the processing in the process module 52a to the process module 52c by the intermediate conveyance chamber 54b and processing it, and therefore, the processing speed of the device as a whole is increased.

In the present embodiment, it may also be possible to configure the conveyance mechanisms 55a to 55c so as to be capable of conveying at least two wafers at the same time. For example, the conveyance mechanisms 55a to 55c are each configured as a wafer holding means having two arms capable of independent operation. With this structure, it is possible, for example, to convey an unprocessed wafer from the load lock chamber 51 to the first process module 52a using one arm of the conveyance mechanism 55a and at the same time to convey a processed wafer from the second process module 52b to the load lock chamber 51 using the other arm of the conveyance mechanism 55a. Because of this, the throughput of the device as a whole is improved.

Figure 1:
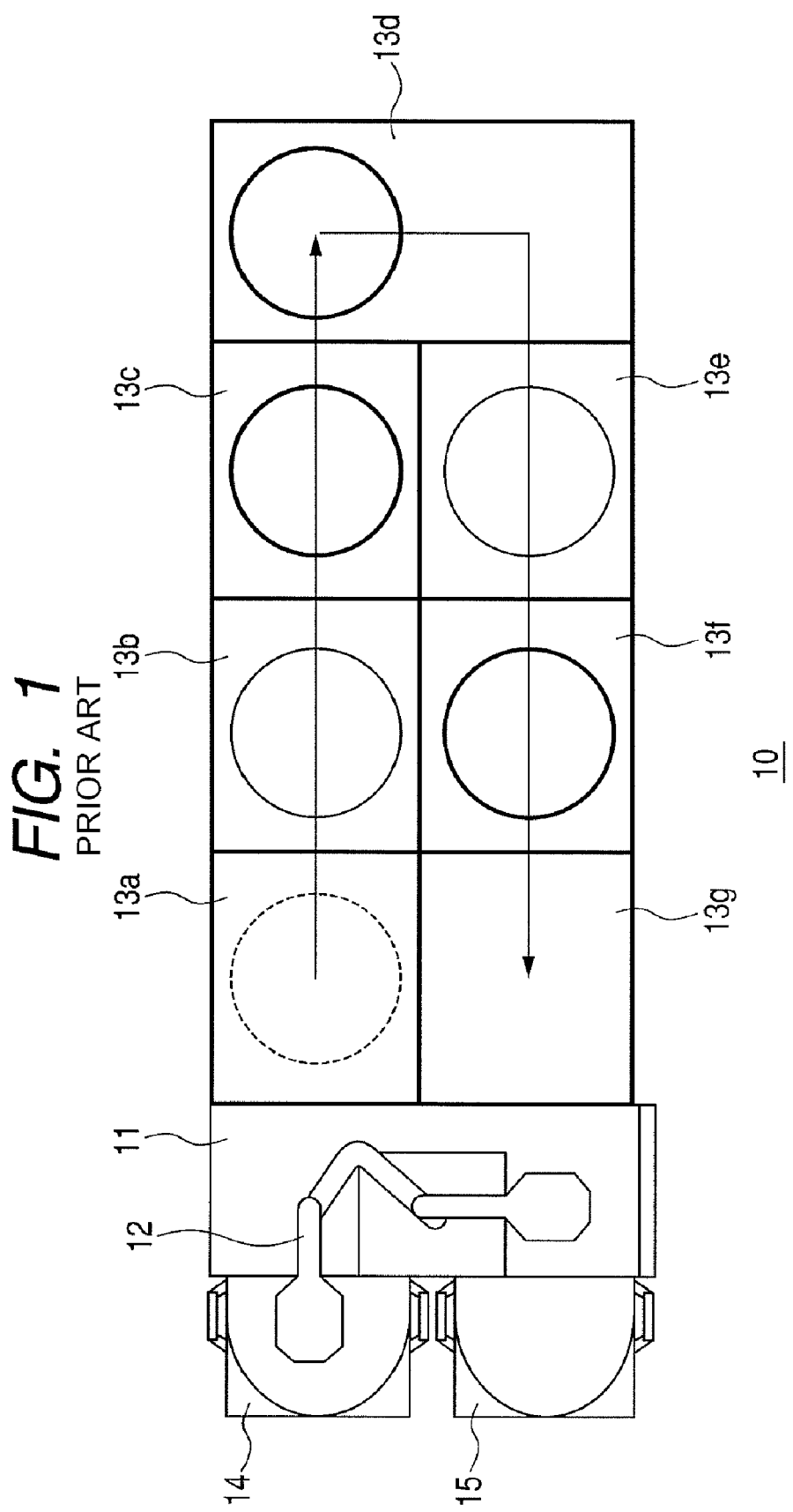
FIG. 1 is a plan view of a conventional inline-type wafer conveyance device.
Figure 2:
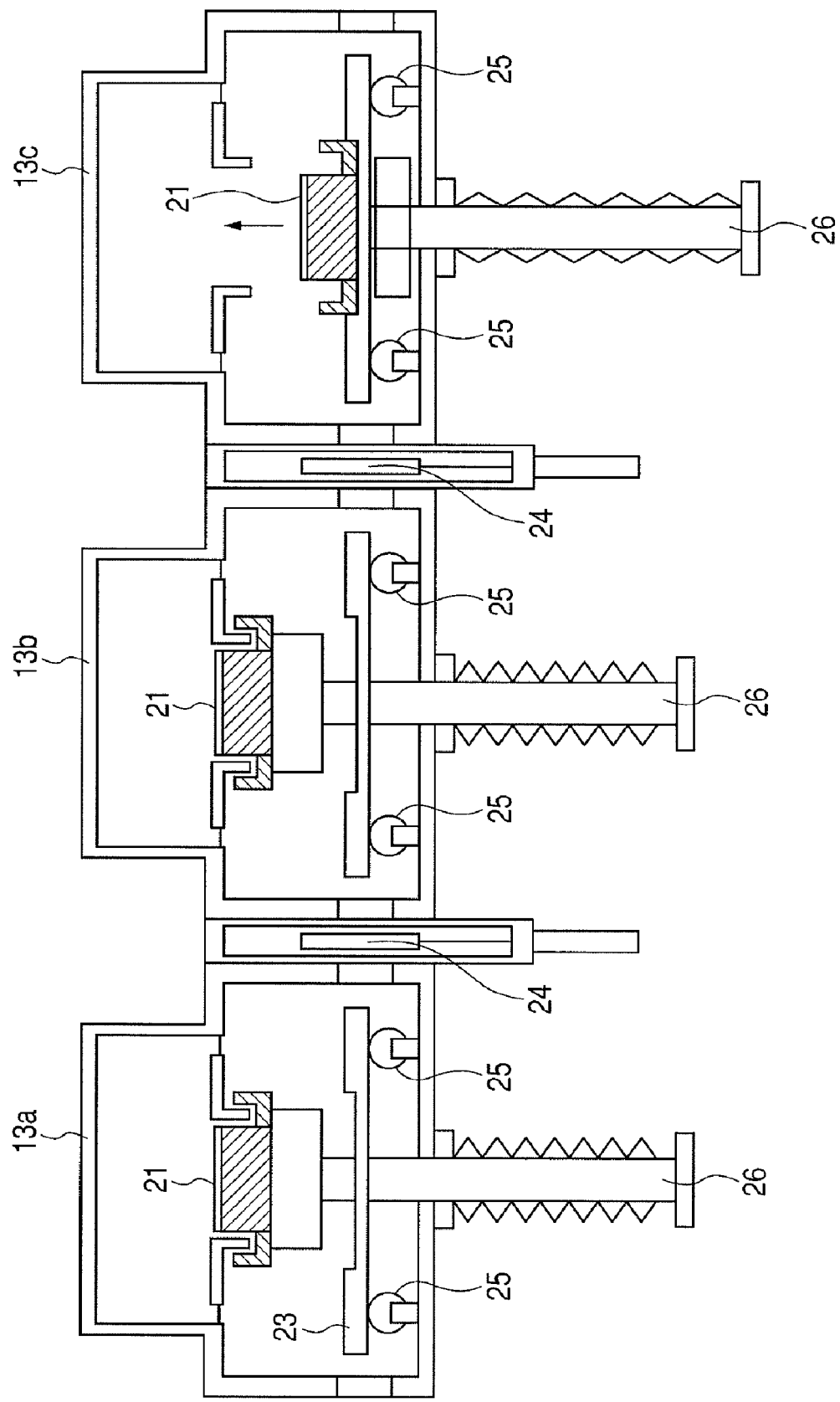
FIG. 2 is a partial section view of the conventional inline-type wafer conveyance device shown in FIG. 1.
Figure 3:
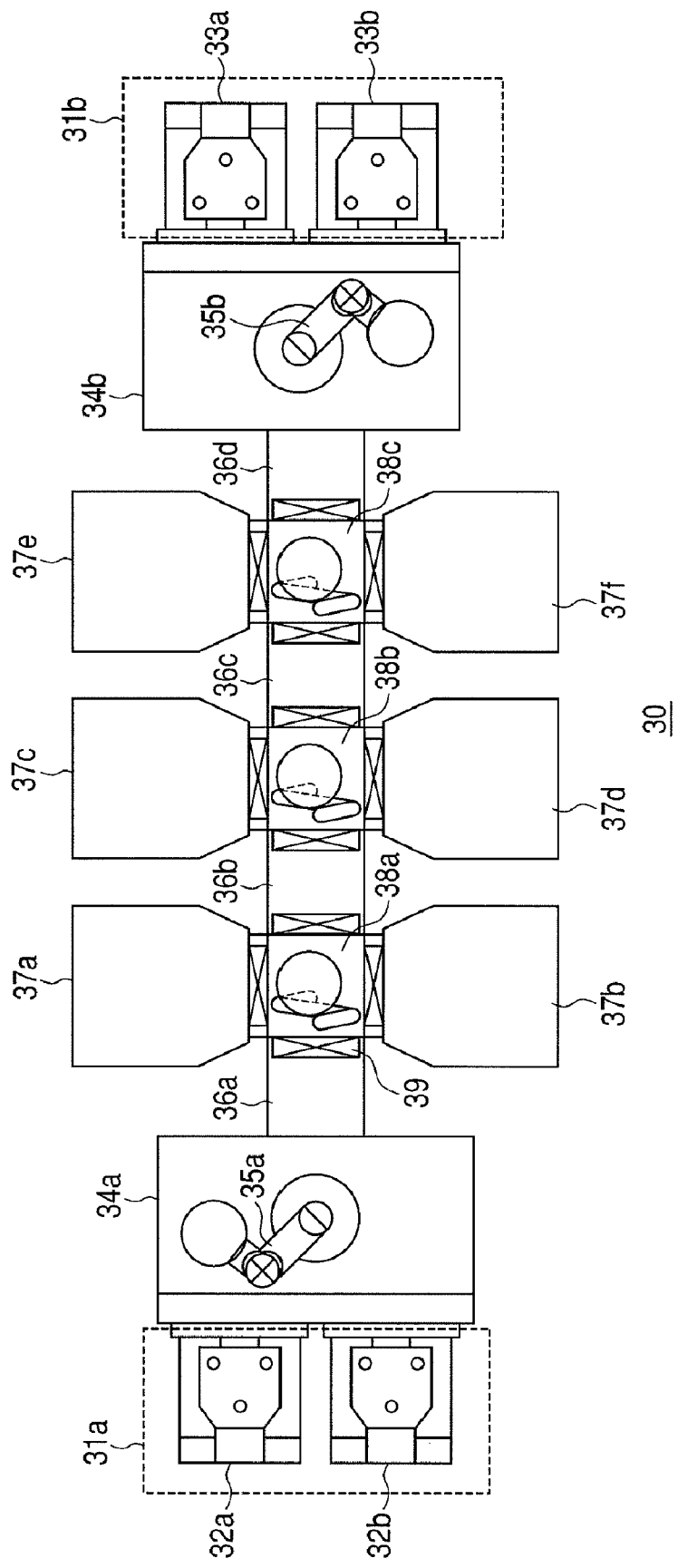
FIG. 3 is a plan view of another conventional inline-type wafer conveyance device.
Figure 4:
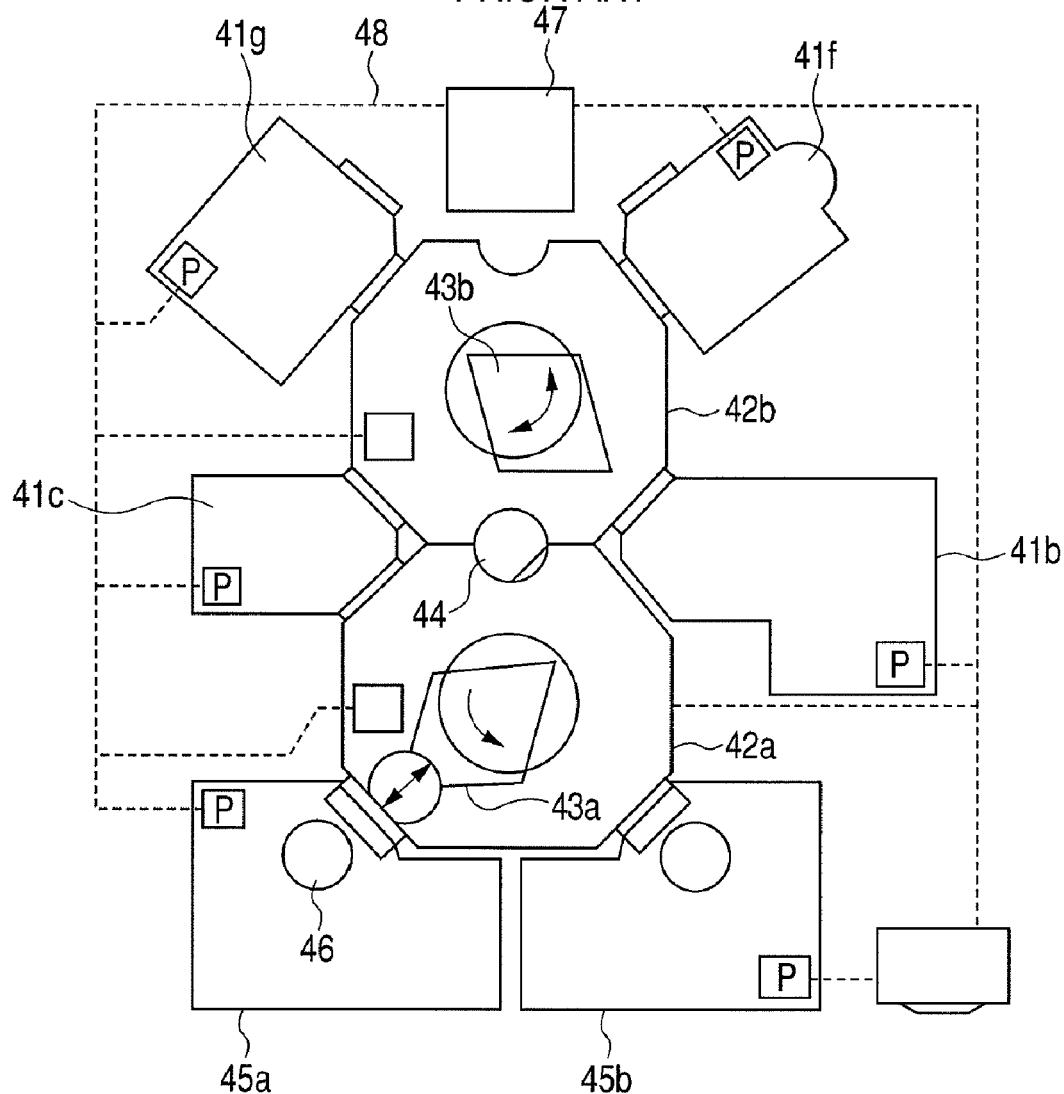
FIG. 4 is a plan view of a conventional cluster-type wafer conveyance device.

The inline-type wafer conveyance device in the present embodiment does not require a transfer mechanism, such as the carrier 23 and the roller 25 shown in FIG. 2. Because of this, particles are unlikely to be generated during the period of conveyance of a wafer. Further, the wafer conveyance device has a simpler structure and a smaller footprint compared to the conveyance device that uses a buffer chamber as shown in FIG. 3. Furthermore, it is not necessary for robots to directly deliver a wafer between them, and therefore, a wafer conveyance device having high reliability can be realized. In addition, the wafer conveyance device has a very simple structure and a small footprint compared to the cluster-type conveyance device shown in FIG. 4. As described above, according to the present invention, it is possible to comprehensively solve the above-mentioned problems of the prior art.

First Embodiment

Figure 6:
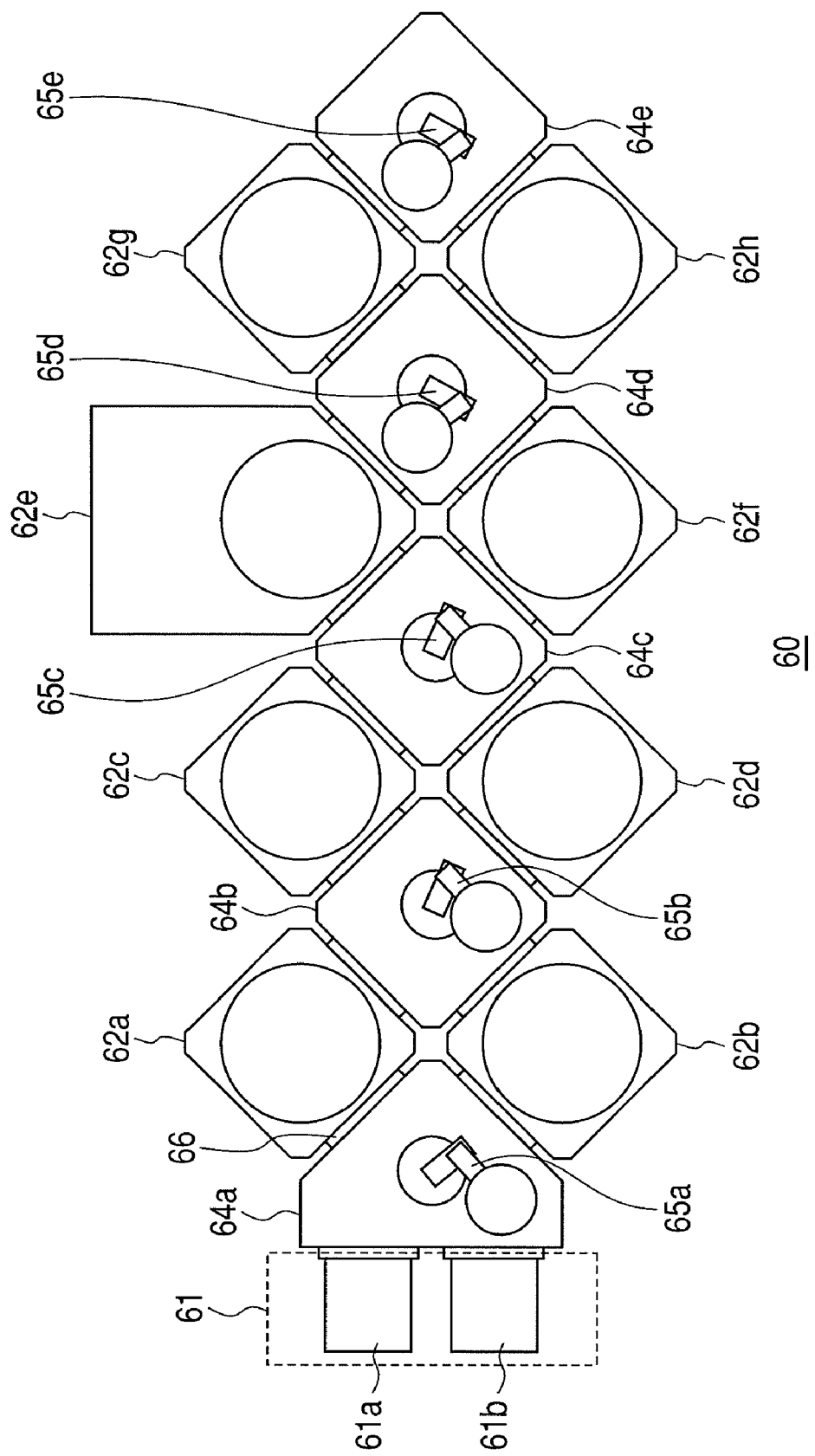
FIG. 6 is a plan view of an embodiment of an inline-type wafer conveyance device according to the present invention.

FIG. 6 is a plan view of an embodiment of the inline-type wafer conveyance device according to the present invention. A wafer conveyance device 60 comprises a FOUP (front opening unified pod) 61 including a load chamber 61a and an unload chamber 61b instead of the load lock chamber 51 in FIG. 5. The FOUP 61 is connected to a first end conveyance chamber 64a. It is of course possible to use the load lock chamber 51 also instead of the FOUP 61.

The wafer conveyance device 60 comprises, in addition to the FOUP 61 described above, the first end conveyance chamber 64a, four sets of a pair of process modules (first process module 62a and second process module 62b, third process module 62c and fourth process module 62d, fifth process module 62e and sixth process module 62f, and seventh process module 62g and eighth process module 62h), intermediate conveyance chambers 64b, 64c and 64d, and a second end conveyance chamber 64e. As in FIG. 5, each component is connected via a gate valve 66. By providing a gate valve, it is possible to reduce the number of foreign substances that enter mixedly between the process modules.

The basic relationship of connection between each component in the wafer conveyance device 60 is the same as that of the wafer conveyance device 50 and characterized by providing the second end conveyance chamber 64e, which is connected to the opposite side of the load lock chamber 51 of the last set of process modules (the seventh process module 62g and the eighth process module 62h in FIG. 6). The second end conveyance chamber 64e is located at the end part of the wafer conveyance device 60.

In addition to the characteristic, the wafer conveyance device 60 is noticeably characterized in the shape of each component. As shown in FIG. 6, each of the intermediate conveyance chambers 64b to 64d has, preferably, substantially a square plane shape when viewed from above. For example, the plane shape of each intermediate conveyance chamber is substantially a square and each intermediate conveyance chamber is disposed so that each side of the square forms an angle of about 45° with respect to the longitudinal direction (horizontal direction in FIG. 6) of the wafer conveyance device 60. The intermediate conveyance chambers 64b to 64d each have four side surfaces in the direction perpendicular to the plane of the paper in FIG. 6 and each side surface is connected to each neighboring process module via the gate valve 66. For example, each side surface may include a horizontal slit to let a wafer pass.

The first end conveyance chamber 64a has, in addition to the side surface connected to the FOUP 61, has two side surfaces for connection to each of the first process module 62a and the second process module 62b belonging to the neighboring set of a pair of process modules. These two side surfaces may include a horizontal slit to let a wafer pass. Further, these two side surfaces are configured so as to form an angle to arrange the first end conveyance chamber 64a, the first and second process modules 62a and 62b, and the first intermediate conveyance chamber 64b with no extra gap left in between. Preferably, the angle is about 90° because the first intermediate conveyance chamber 64b has substantially a square plane shape.

Each of the process modules 62a to 62h has two side surfaces for connection to the neighboring first end conveyance chamber 64a, the intermediate conveyance chambers 64b to 64d, or the second end conveyance chamber 64e. These two side surfaces may include a horizontal slit to let a wafer pass. Further, these two side surfaces are configured so as to form an angle in order to arrange each conveyance chamber and each process module with no extra gap left in between. For example, the angle is about 90°. The process modules 62a to 62h do not necessarily have substantially a square plane shape and may have various plane shapes, such as reference numeral 62e shown in FIG. 6.

The second end conveyance chamber 64 at least has two side surfaces for connection to the two process modules 62g and 62h belonging to the neighboring set of a pair of process modules. These two side surfaces may include a horizontal slit to let a wafer pass. Further, these two side surfaces are configured so as to form an angle in order to arrange the second end conveyance chamber 62e and the two neighboring process modules 62g and 62h with no extra gap left in between. For example, the angle is about 90°.

It is possible to configure the conveyance chamber and the process module so as to have various plane shapes, such as a square and a circle, and the side surface with the above-described structure is not necessarily required. It is only required to design the structure so that the pair of process modules (for example, 62a and 62b in FIG. 6) belonging to each set of process modules is connected to one of the neighboring conveyance chambers (for example, 65a in FIG. 6) via one of two gate valves the directions of which are perpendicular to each other and connected to the other neighboring conveyance chamber (for example, 65b in FIG. 6) via the other gate valve, respectively.

The process modules 62a to 62h are configured so as to be capable of performing, for example, etching processing, physical vapor deposition (PVD) processing, chemical vapor deposition (CVD) processing, thermal processing, alignment (positioning) processing, etc. As shown in FIG. 6, it is possible to configure the wafer conveyance device in the present embodiment so as to comprise a number of conveyance chambers while keeping its footprint small compared to the prior art by arranging the conveyance chambers and process modules having a compact structure with no gap left in between.

At the time of processing in each process module, a wafer is placed on a stage within the process module. In the present embodiment, each conveyance chamber only moves a wafer from a certain process module to the next process module, and does not require a complicated wafer conveyance. Further, it is not indispensable to dispose a buffer chamber for once placing a wafer along the way of the conveyance path.

In the present embodiment, it is also possible to convey an unprocessed wafer from the load chamber 61a to the process module 62a by the first end conveyance chamber 64a while conveying a wafer having been subjected to the processing in the process module 62a to the process module 62c by the intermediate conveyance chamber 65b and processing it, and therefore, the processing speed of the device as a whole is increased.

Then, it may also be possible to configure each conveyance mechanism as a robot having two arms capable of independent operation and at the same time to configure it so as to be capable of simultaneously conveying at least two wafers. With such a structure, it is possible for the wafer conveyance device in the present embodiment to achieve higher throughput compared to, for example, the conventional wafer conveyance device shown in FIG. 4.

With the structure as shown in FIG. 6, the maximum number n of process modules that can be arranged in the wafer conveyance device can be expressed as n=2 (m−1). Here, m is the number of conveyance chambers (first end conveyance chamber, intermediate conveyance chambers, and second end conveyance chamber).

Figure 7:
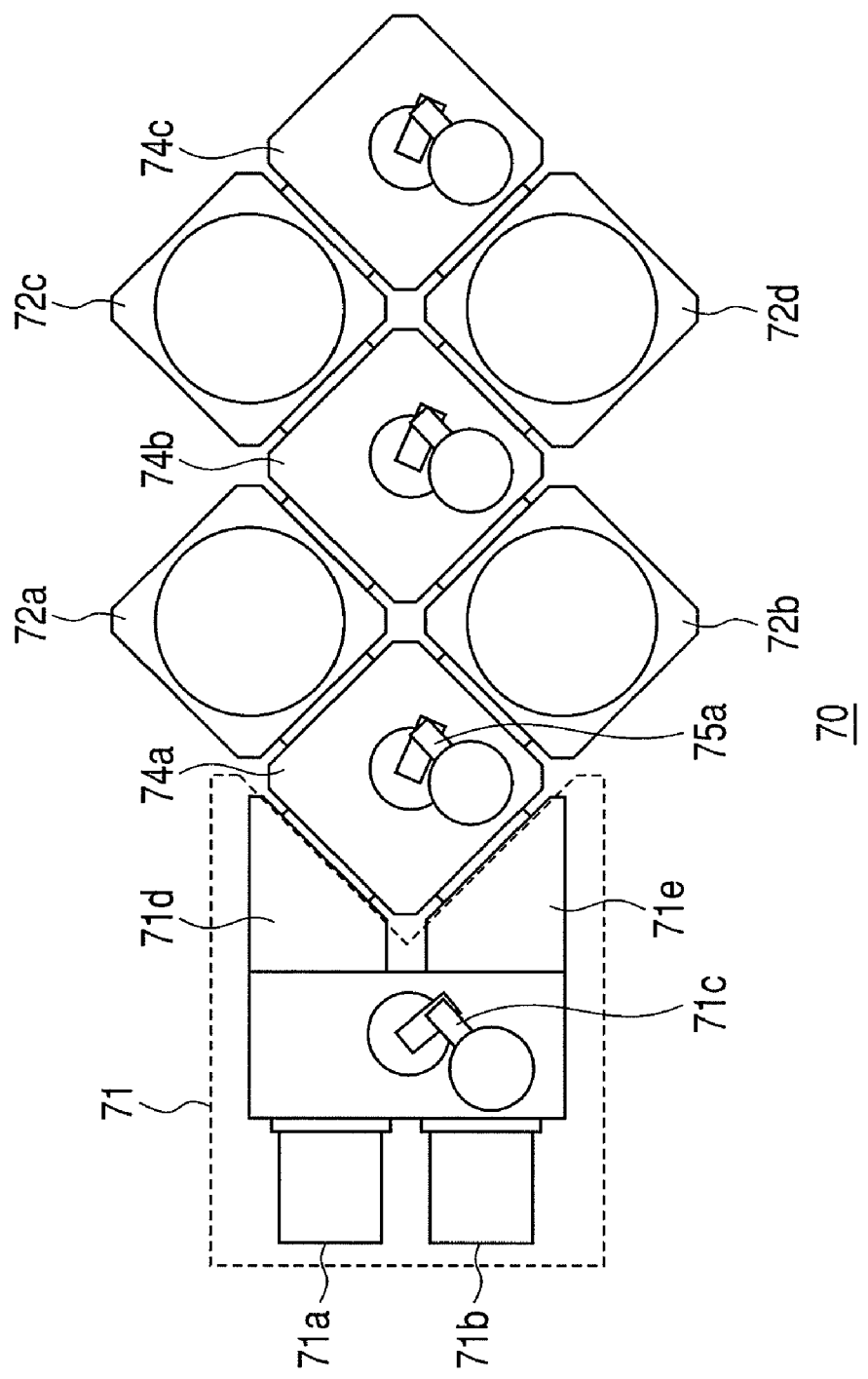
FIG. 7 is a plan view of another structure example of an inline-type wafer conveyance device according to the present embodiment.

A plan view of another structure example of the wafer conveyance device according to the present embodiment is shown in FIG. 7. A wafer conveyance device 70 comprises a load lock chamber 71, a first end conveyance chamber 74a, one intermediate conveyance chamber 74b, a second end conveyance chamber 74c, and first to fourth process modules 72a to 72d.

The load lock chamber 71 includes a load chamber 71a, an unload chamber 71b, a conveyance mechanism 71c, a first buffer chamber 71d and a second buffer chamber 72e. The first end conveyance chamber 74a has substantially a square plane shape and has, in addition to first and second side surfaces connected to the process modules 72a and 72b, third and fourth side surfaces connected to the first and second buffer chambers 71d and 71e of the load lock chamber 71, respectively. An unprocessed wafer is carried into the load chamber 71a from outside and placed in the buffer chamber 71d by the conveyance mechanism 71c. The wafer is conveyed from the buffer chamber 71d to the first process module 72a using a conveyance mechanism 75a of the first end conveyance chamber 74a. After that, the processed wafer having been conveyed and subjected to processing in a manner similar to that in FIG. 6, is carried into the second buffer chamber 71e from the second process module 72b by the conveyance mechanism 75a and further, is conveyed to the unload chamber 71b by the conveyance mechanism 71c within the load lock chamber 71 and carried out to outside. The wafer conveyance device 70 also exhibits the same effect as that of the wafer conveyance device 60 in FIG. 6.

Even if the first end conveyance chamber 74a has a circular plane shape or a plane shape other than a square, it is possible to apply the load lock chamber 71 in FIG. 6. In this case, the first end conveyance chamber 74a is connected to, for example, each of the first and second buffer chambers via two gate valves having directions perpendicular to each other.

Figure 8:
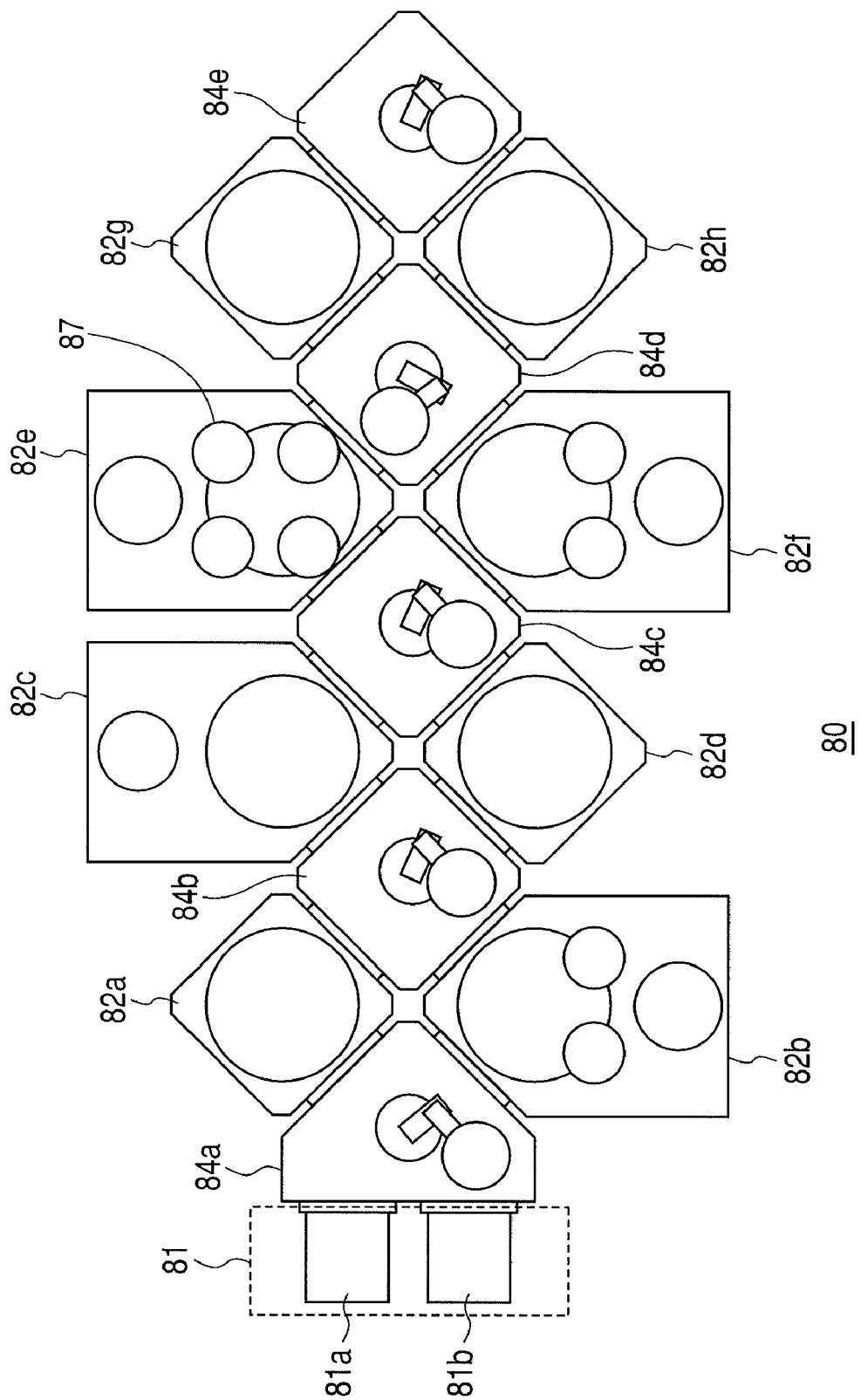
FIG. 8 is a diagram showing a structure example when a specific process is performed in a structure similar to that of the wafer conveyance device in FIG. 6.

A structure example when a specific process is performed in a structure similar to that of the wafer conveyance device 60 in FIG. 6 is shown in FIG. 8. In FIG. 8, each wafer passes through various process modules 82a to 82h and returns to a FOUP 81 after having been subjected to processing. As an example, in FIG. 8, the first process module 82a is a thermal process module for cleaning the contamination of a wafer and the third process module 82c is an etching module for removing oxide on a wafer. Further, the fifth process module 82e is a PVD module having a cathode electrode 87 holding four targets for forming films of different materials on a wafer by simultaneous sputtering or film formation processes at least in order. The seventh process module 82g and the eighth process module 82h are each a PVD module having a single target. The sixth process module 82f and the second process module 82b are each a PVD module having two targets. The fourth process module 82d is a buffer module for aligning (positioning) a wafer or performing thermal processing.

As shown schematically, each process module has a different size, however, its two side surfaces to be connected to neighboring conveyance chambers are configured so as to enable an arrangement in which there is no extra gap left between the side surfaces and the conveyance chambers. These side surfaces may each include a slit to let a wafer pass during the period of conveyance of a wafer. Preferably, the stage within each process module is also arranged at the same position in the vertical direction with respect to these slits. Due to this, it is made easier to convey a wafer by a conveyance mechanism. As to a large-sized process module, it may also be possible to configure at least one neighboring conveyance chamber so as to be smaller in size than the other neighboring conveyance chambers.

In order to obtain high throughput, it is necessary to make the processing time in each process module substantially the same. When the tact time required to process one wafer throughout the whole of a wafer conveyance device 80 is 36 seconds, the throughput of the wafer conveyance device 80 is 100 pph and 100 wafers can be processed in one hour. When the tact time is 12 seconds, the throughput is 300 pph and 300 wafers can be processed in one hour.

Further, if each conveyance chamber is configured so as to have two independent arms capable of simultaneously conveying two wafers, the conveyance time can be reduced further, and therefore, the throughput is improved. In this case, for example, while a wafer is conveyed from the first process module 82a to the third process module 82c by one arm of the conveyance mechanism within a first intermediate conveyance chamber 84b, another wafer is conveyed from the fourth process module 82d to the fourth process module 82b by the other arm within the first intermediate conveyance chamber 84b.

The wafer conveyance device 80 shown in FIG. 8 uses a variety of process modules compared to the example shown in FIG. 6 and is capable of continuously performing eight kinds of processing regardless of the shape of the process module and exhibits a unique effect that throughput is high. If the number of process modules and conveyance chambers is increased further, it is possible to continuously perform more kinds of processing on a wafer.

Figure 9:
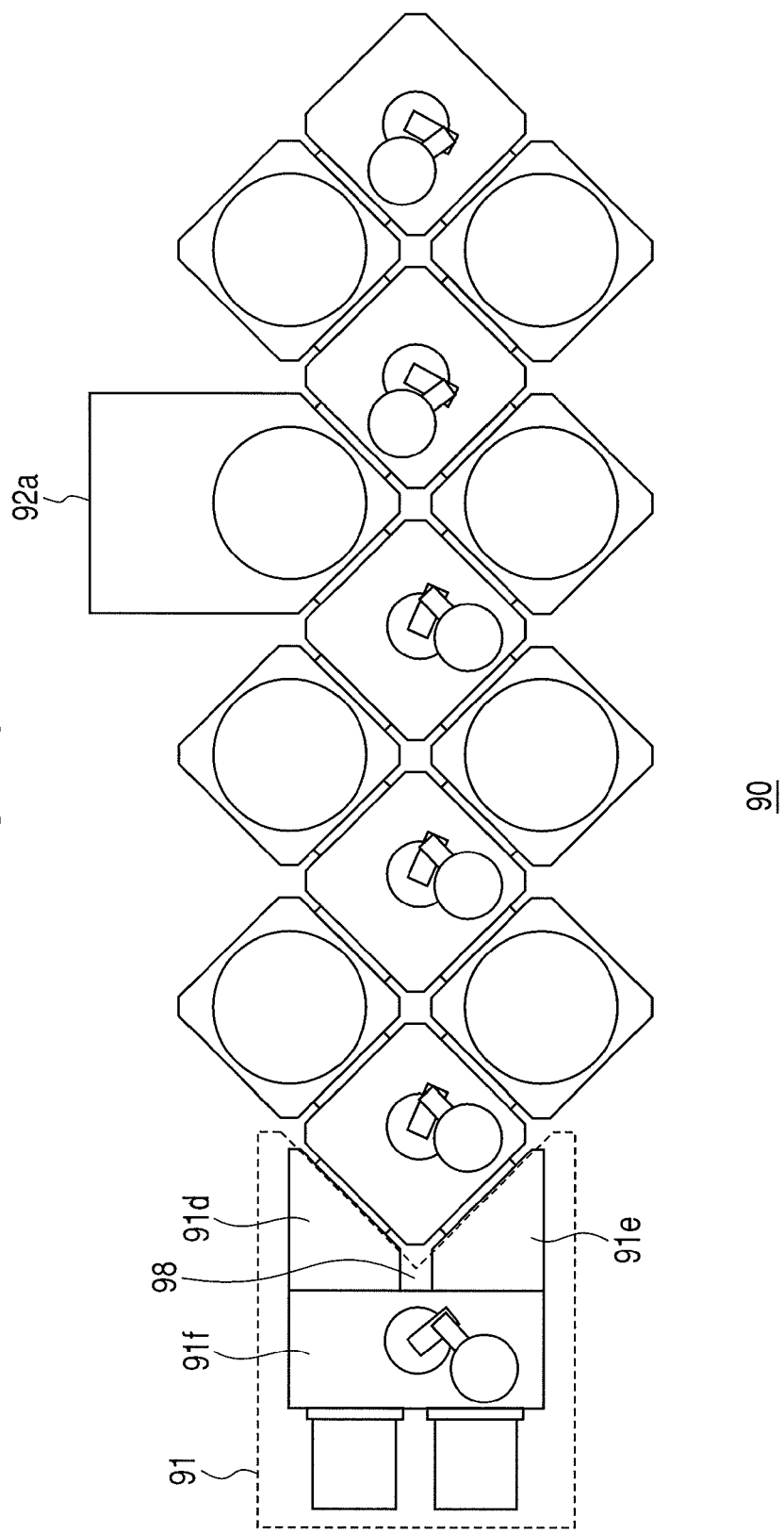
FIG. 9 is a diagram showing a structure example when the number of process modules and intermediate conveyance chambers is increased in a structure similar to that of the wafer conveyance device in FIG. 7.

A structure example in which the number of process modules and intermediate conveyance chambers is increased in a structure similar to that of the wafer conveyance device 70 is shown in FIG. 9. As described already, it is possible to use a variety of process modules, such as 92a in FIG. 9. The maximum number n of process modules that can be arranged is expressed as n=2 (m−1). Here, m is the number of conveyance chambers including a conveyance chamber 91f within a FOUP 91.

In a wafer conveyance device 90 in FIG. 9, there is a space 98a between buffer chambers 91d and 91e, and therefore, it is possible to add a feature, such as aligner, to this part.

Figure 10:
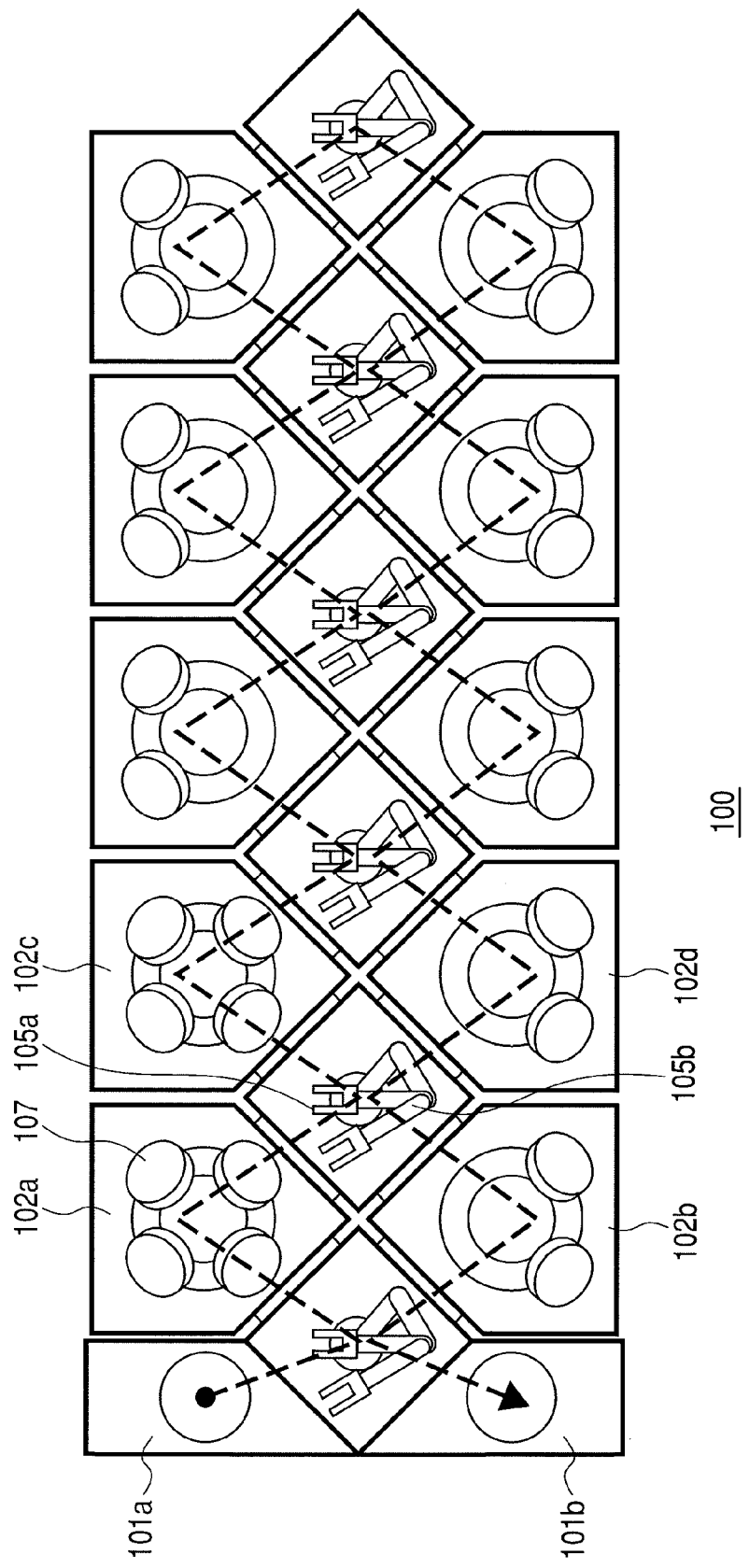
FIG. 10 is a diagram showing a specific example of a structure similar to that of the wafer conveyance device in FIG. 6.

An example that specifically represents a structure similar to that of the wafer conveyance device 60 in FIG. 6 is shown in FIG. 10. A wafer conveyance device 100 comprises 10 process modules having two or four cathode electrodes 107 that hold various target materials. Further, each conveyance chamber has a double arm structure in which two arms 105a and 105b are included. A wafer is conveyed from a load chamber 101a to an unload chamber 101b as shown by a dotted line with arrow in the figure and processed in each process module. The double arm structure makes it possible to convey, while conveying a wafer from a first process module 102a to a third process module 102c using the one arm 105a, another wafer from a fourth process module 102d to a second process module 102b. Because of this, the throughput of the wafer conveyance device 100 as a whole is increased.

Figure 11:
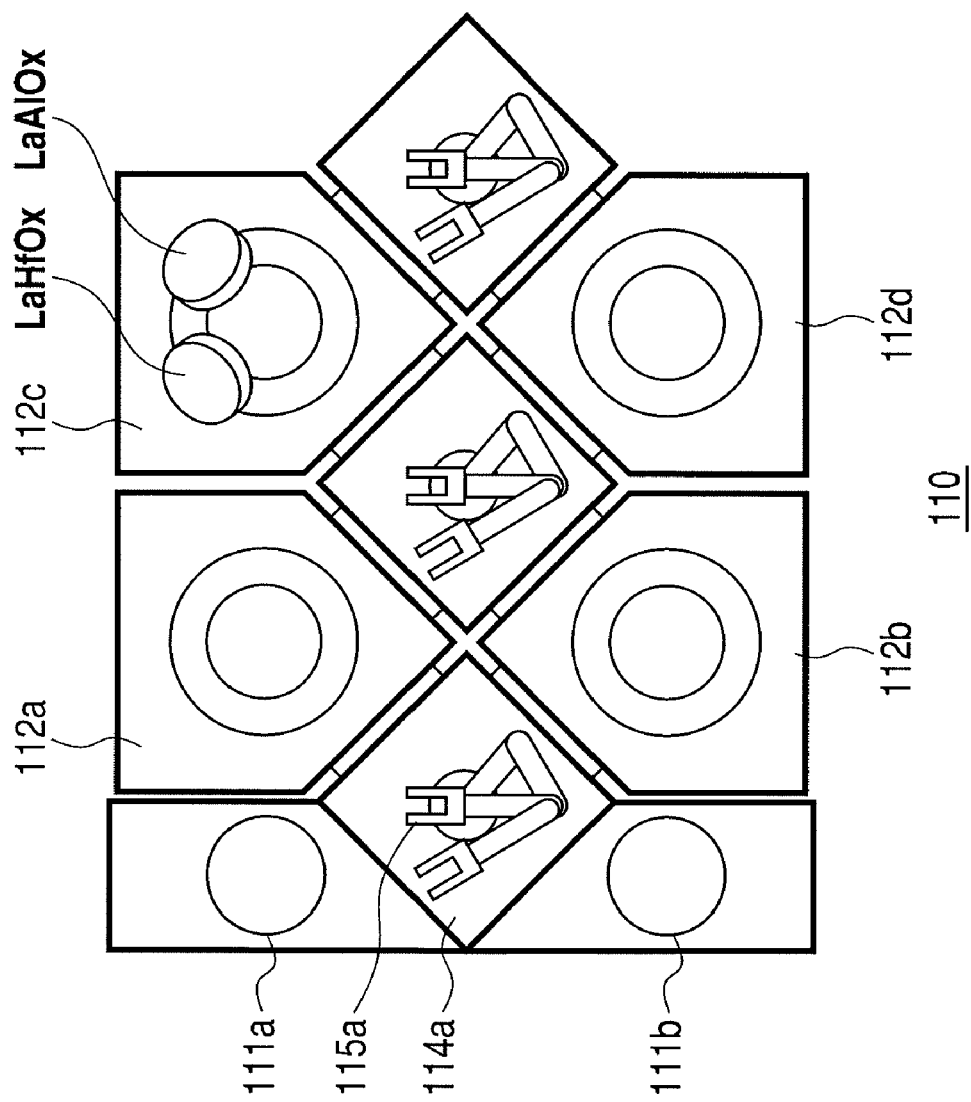
FIG. 11 is a diagram showing a case where an actual process is performed using the inline-type wafer conveyance device in the present embodiment similar to that described in FIG. 7.

FIG. 11 shows a case where an actual process is performed using an inline-type wafer conveyance device 110 in the present embodiment, which resembles that illustrated in FIG. 7. It is supposed to form an insulating film, such as LaHfOx and LaAlOx, used in a semiconductor device on a wafer.

First, after an unprocessed wafer is carried into a load chamber 111a from the outside (atmosphere side) of the load chamber 111a, the load chamber 111a is evacuated using an evacuation mechanism (not shown schematically). Next, the unprocessed wafer is carried into a first process module 112a using a first wafer holding means 115a constituting a conveyance mechanism within a first end conveyance chamber 114a and degassing processing of the wafer or pre-cleaning of the wafer is performed. Next, within a third process module 112c, an LaHfOx film, an LaAlOx film, or a laminated film of these is formed on the wafer by RF sputtering. For example, the third process module 112c internally includes a cathode electrode that holds a target material LaHfOx or LaAlOx. When a gas, for example, argon (Ar) gas, is introduced into the third process module 112c through a gas introduction inlet (not shown schematically) and further, RF power is applied to the above-mentioned cathode electrode, plasma is generated within the process module 112c. Ar ions etc. drawn out from the plasma collide with the target and a desired film is formed on the wafer as sputtered particles. If necessary, after UHV annealing is performed on the wafer within a fourth process module 112d and then predetermined processing is performed within a second process module 112b, the finally processed wafer is carried out from an unload chamber 111b.

Figure 12:
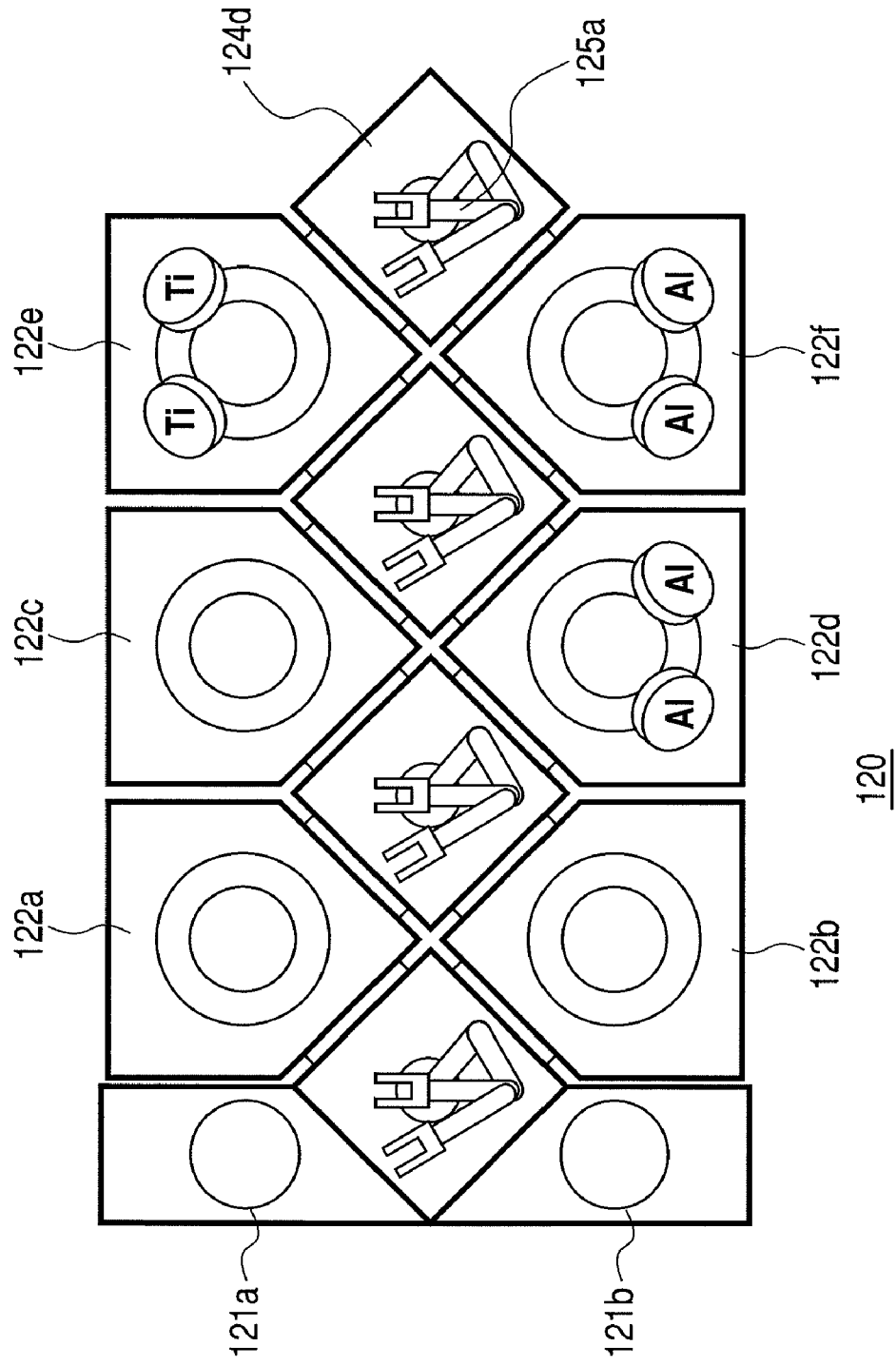
FIG. 12 is a diagram showing a case where an actual process is performed after adding further two process modules and one intermediate conveyance chamber to the inline-type wafer conveyance device illustrated in FIG. 11.

FIG. 12 shows a case where an actual process is performed after adding further a fifth process module 122e and a sixth process module 122f and one intermediate conveyance chamber to the inline-type wafer conveyance device illustrated in FIG. 11. A flow of procedure for forming a wiring Al film including via hole filling used in a memory system device is supposed. The film structure is designed as, for example, Ti (20 nm)/TiN (60 nm)/Seed-Al (200 nm)/Fill-Al (450 nm).

First, an unprocessed wafer is carried into a load chamber 121a from outside (atmosphere side) and the load chamber 121a is evacuated. Next, after the unprocessed wafer is carried into a first process module 122a, a degas processing of the wafer is performed and pre-cleaning of the wafer surface is performed within a third process module 122c. Next, the wafer is carried into the fifth process module 122e, and a titanium film (for example, 20 nm) and a TiN film (for example, 60 nm) are formed sequentially. Next, using a conveyance mechanism 125a within a second end conveyance chamber 124d, the wafer is carried into the sixth process module 122f from the fifth process module 122e and a Seed-Al film (for example, 200 nm) is formed. Next, the wafer is carried into a fourth process module 122d from the sixth process module 122f and a Fill-Al film (for example, 450 nm) is formed. Next, the wafer is carried into a second process module 122b from the fourth process module 122d and after having cooled down, the above-mentioned wafer is carried out from an unload chamber to outside (atmosphere side). In FIG. 12, the Ti film having a thickness of 20 nm is formed in 122e and the Seed-Al film having a thickness of 200 nm is formed in 122f, however, by preparing the two process modules 122e, it is also possible to form a Ti film having a thickness of 10 nm in the first process module and form a Ti film having a thickness of 10 nm in the second process module, and then form a Ti film having a total thickness of 20 nm. For example, if the film formation in 122e requires two minutes and the film formation in 122f requires one minute, by preparing the two chambers 122e, it is possible to eliminate a wafer that waits for processing and the throughput can be increased as a result.

Figure 13:
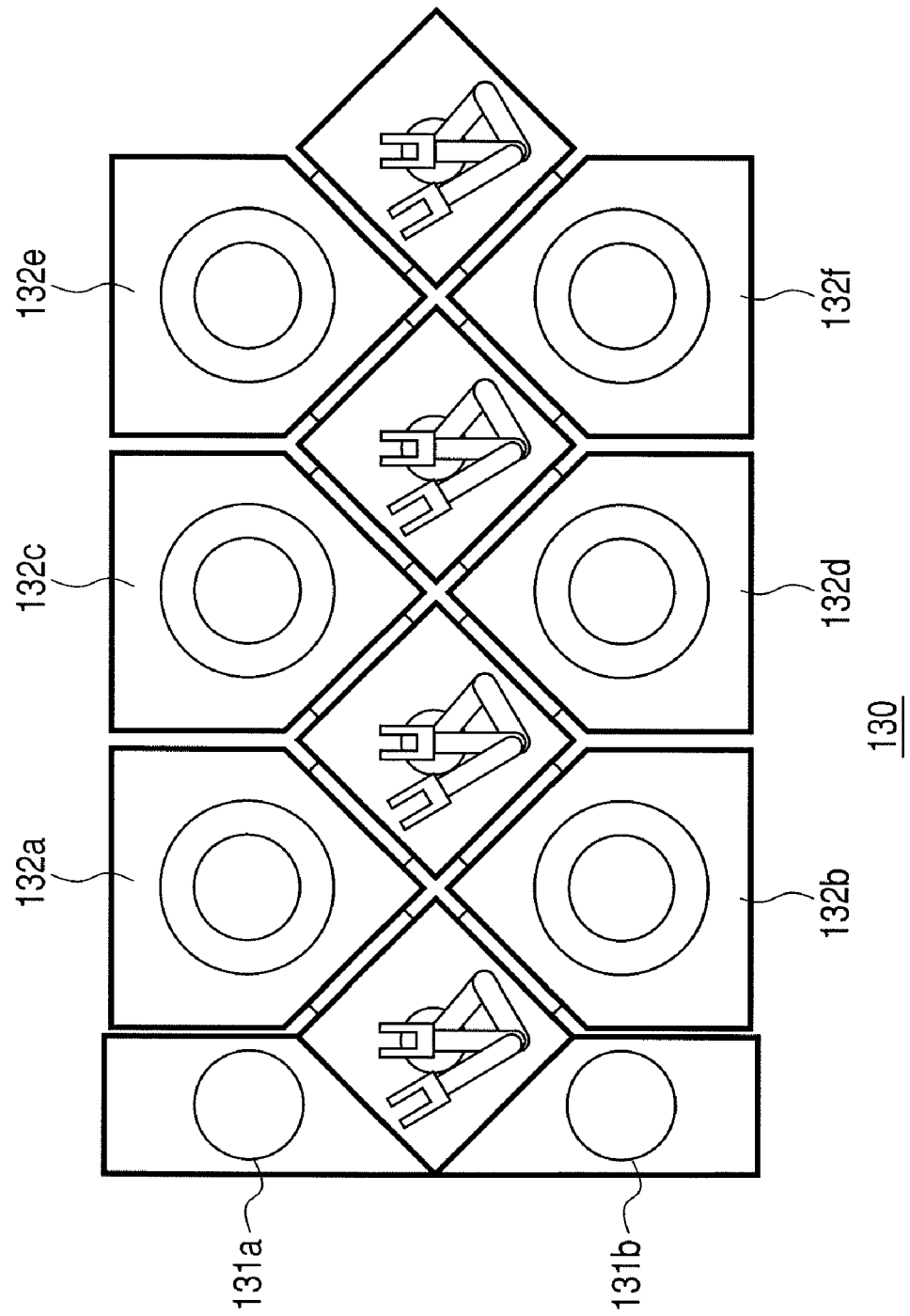
FIG. 13 is a diagram showing a case where an actual process is performed using an inline-type wafer conveyance device similar to that in FIG. 12.

FIG. 13 shows a case where an actual process is performed using an inline-type wafer conveyance device 130 similar to that in FIG. 12. A supposed process is a processing/film formation continuous process for forming a cover film by CVD after etching a magnetic laminated film without exposing it to the atmosphere. For example, the structure of a film to be etched is PR/Ta/TMR. An unprocessed wafer carried in from outside is conveyed from a load chamber 131a to a first process module 132a. First, if necessary, trimming of a first resist is performed in the first process module 132a and reactive ion etching (RIE) of a Ta film is performed with a $CF_4$-based gas using the resist as a mask in a third process module 132c. Further, the resist is removed in the same module 132c for the purpose of resist peeling. After the wafer is conveyed to a fifth process module 132e, RIE is performed in a $CH_3OH$ process on a magnetic laminated film having a TMR structure in the module. Further, the wafer is conveyed to a sixth process module 132f and ion beam etching (IBE) is performed to clean the surface after RIE with $CH_3OH$. After the wafer that has been subjected to IBE is conveyed continuously in a vacuum, a nitride film, an oxide film, a carbon film, etc., are formed by the plasma chemical vapor deposition (CVD) or remote plasma CVD in a fourth process module 132d. Furthermore, if necessary, a predetermined process is performed in a second process module 132b.

Figure 14:
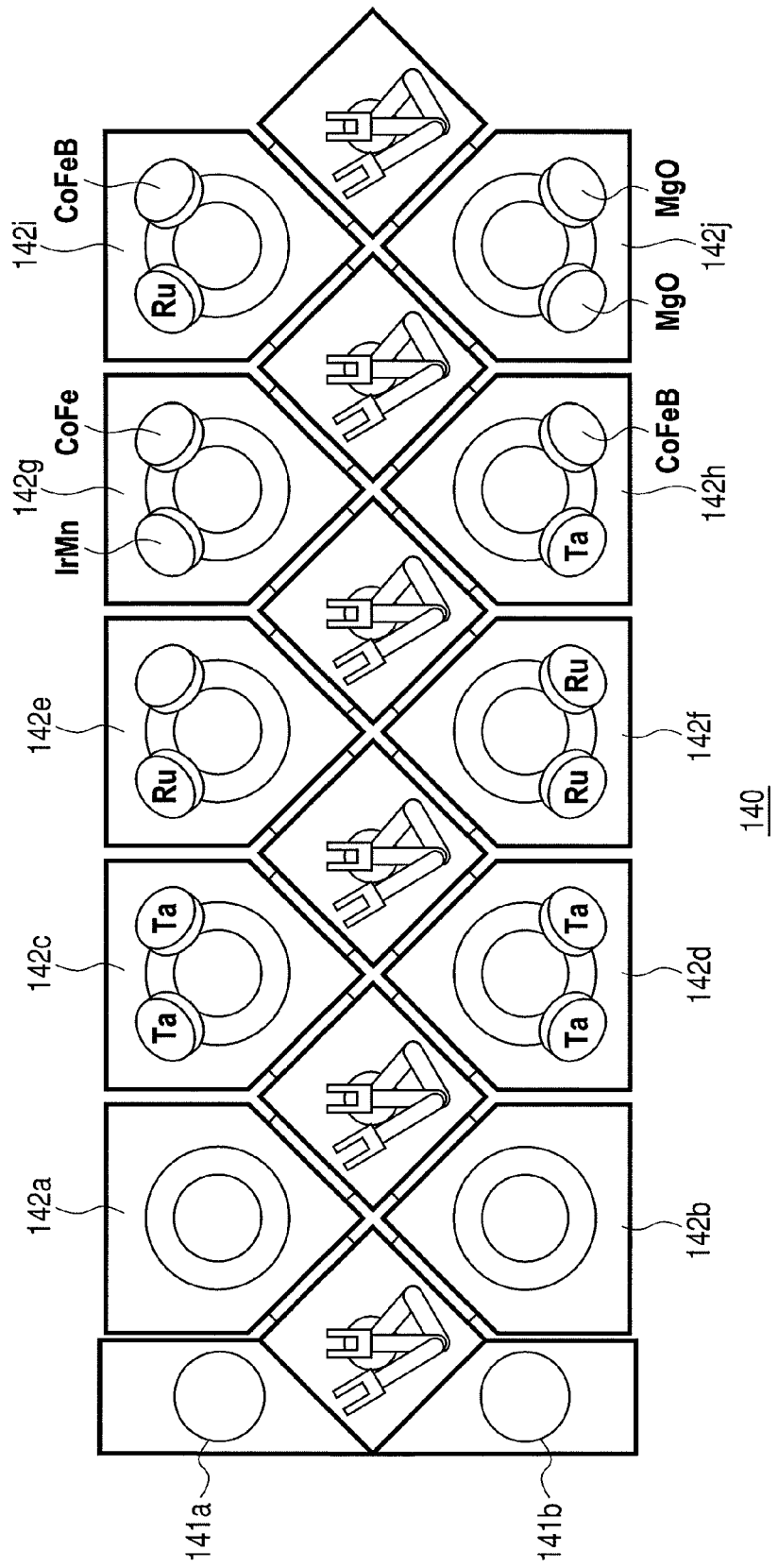
FIG. 14 is a diagram showing a case where an actual process is performed using an inline-type wafer conveyance device like that illustrated in FIG. 10.

FIG. 14 shows a case where an actual process is performed using an inline-type wafer conveyance device 140 as illustrated in FIG. 10. A flow of procedure for forming a TMR laminated film in a storage cell part used in a magnetic resistance random access memory (MRAM) is supposed. The film structure is designed as, for example, Ta (20 nm)/Ru (5 nm)/IrMn (7 nm)/CoFe (2.5 nm)/Ru (0.9 nm)/CoFeB (3 nm)/MgO (1 nm)/CoFeb (3 nm)/Ta (2 nm)/Ru (10 nm)/Ta (30 nm).

After etching of a wafer is performed in a first process module 142a, a Ta film (for example, 20 nm) is formed in a third process module 142c, a Ru film (for example, 5 nm) in a fifth process module 142e, an IrMn film (for example, 7 nm) and a CoFe film (for example, 2.5 nm) in a seventh process module 142g, and an Ru film (for example, 0.9 nm) and a CoFeB film (for example, 3 nm) in a ninth process module 142i, respectively, by DC sputtering. Further, in a tenth process module 142j, an MgO film (for example, 1 nm) is formed by RF sputtering. Furthermore, in an eighth process module 142h, a CoFeB film (for example, 3 nm) and a Ta film (for example, 2 nm) are formed, a Ru film (for example, 10 nm) in a sixth process module 142f, and a Ta film (for example, 30 nm) in a fourth process module 142d, respectively, by DC sputtering. Further, if necessary, predetermined processing is performed in a second process module 142b. In the above-mentioned process, the MgO film is formed by RF sputtering. In FIG. 14, the Ta film having a thickness of 20 nm is formed in 142c and the Ru film having a thickness of 5 nm is formed in 142e, however, by preparing the two process modules 142c, it is also possible to form a Ta film having a thickness of 10 nm in the first process module and form a Ta film having a thickness of 10 nm in the second process module, and then form a Ta film having a total thickness of 20 nm. For example, if the film formation in 142c requires two minutes and the film formation in 142e requires one minute, by preparing the two chambers 142c, it is possible to eliminate a wafer that waits for processing and the throughput can be increased as a result.

In FIG. 14, the first process module 142a is an etching module.

Figure 15:
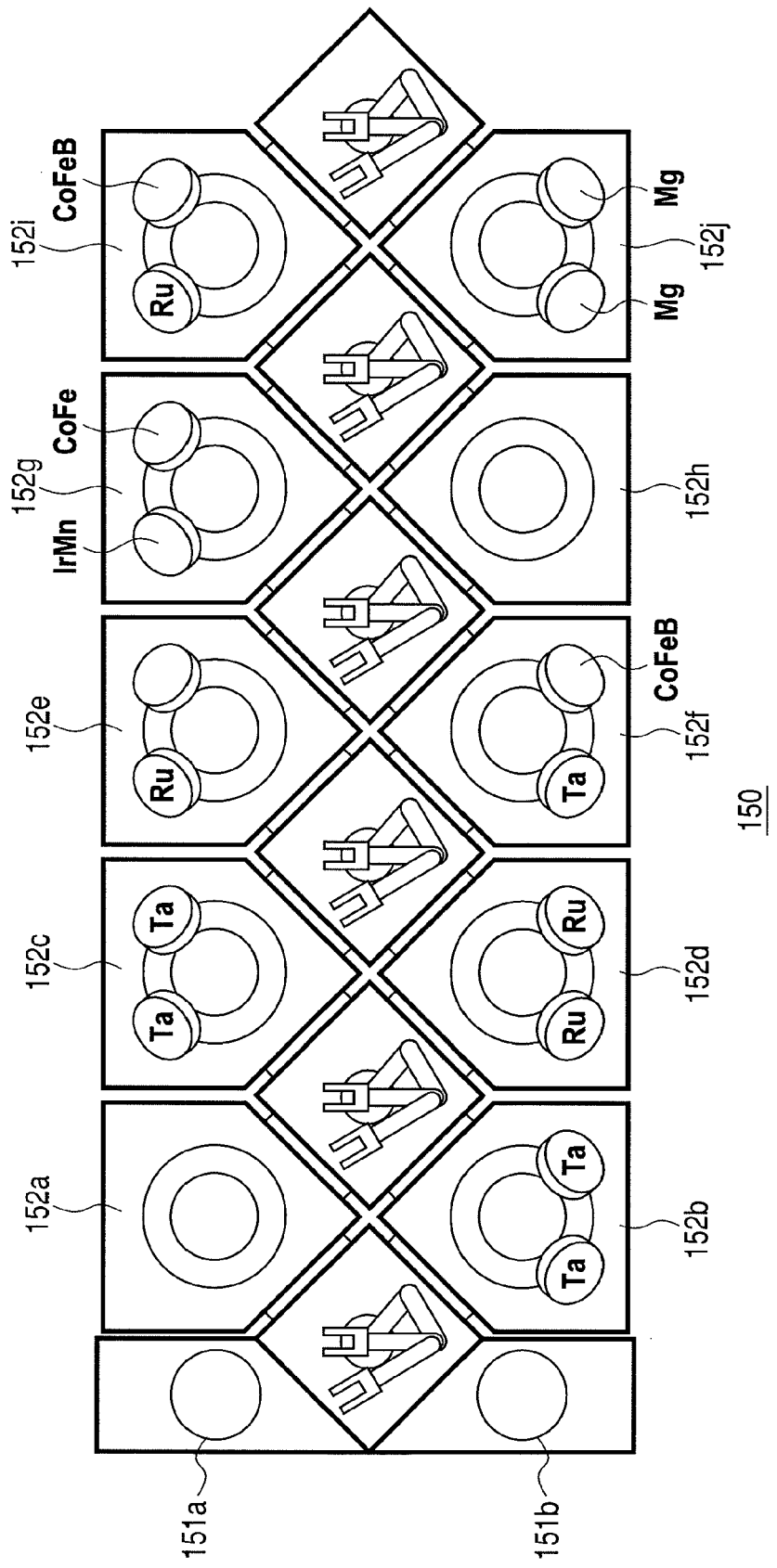
FIG. 15 is a diagram showing a case where an actual process is performed using an inline-type wafer conveyance device similar to that in FIG. 14.

FIG. 15 shows a case where an actual process is performed using an inline-type wafer conveyance device 150 similar to that in FIG. 14. A flow of procedure for forming a TMR laminated film in a storage cell part used in an MRAM is supposed. The film structure is designed as, for example, Ta (20 nm)/Ru (5 nm)/IrMn (7 nm)/CoFe (2.5 nm)/Ru (0.9 nm)/CoFeB (3 nm)/MgO (1 nm)/CoFeB (3 nm)/Ta (2 nm)/Ru (10 nm)/Ta (30 nm).

After etching of a wafer is performed in a first process module 152a, a Ta film (for example, 20 nm) is formed in a third process module 152c, an Ru film (for example, 5 nm) in a fifth process module 152e, an IrMn film (for example, 7 nm) and a CoFe film (for example, 2.5 nm) in a seventh process module 152g, and an Ru film (for example, 0.9 nm) and a CoFeB film (for example, 3 nm) in a ninth process module 152i, respectively. Further, in a tenth process module 152j, an Mg film (for example, 1 nm) is formed and the Mg film is oxidized in an eighth process module 152h. Then, in a sixth process module 152f, a CoFeB film (for example, 3 nm) and a Ta film (for example, 2 nm) are formed, an Ru film (for example, 10 nm) in a fourth process module 152d, and a Ta film (for example, 30 nm) in a second process module 152b, respectively. In the above-mentioned process, the Mg film is formed by DC sputtering and then the MgO film is formed in the oxidation process. In FIG. 15, the Ta film having a thickness of 20 nm is formed in 152c and the Ru film having a thickness of 5 nm in 152e, however, by preparing the two process modules 152c, it is also possible to form a Ta film having a thickness of 10 nm in the first process module and form a Ta film having a thickness of 10 nm in the second process module, and then form a Ta film having a total thickness of 20 nm. For example, if the film formation in 152c requires two minutes and the film formation in 152e requires one minute, by preparing the two chambers 152c, it is possible to eliminate a wafer that waits for processing and the throughput can be increased as a result.

In FIG. 15, the first process module 152a is an etching module and the eighth process module 152h is an oxidation module.

Figure 16:
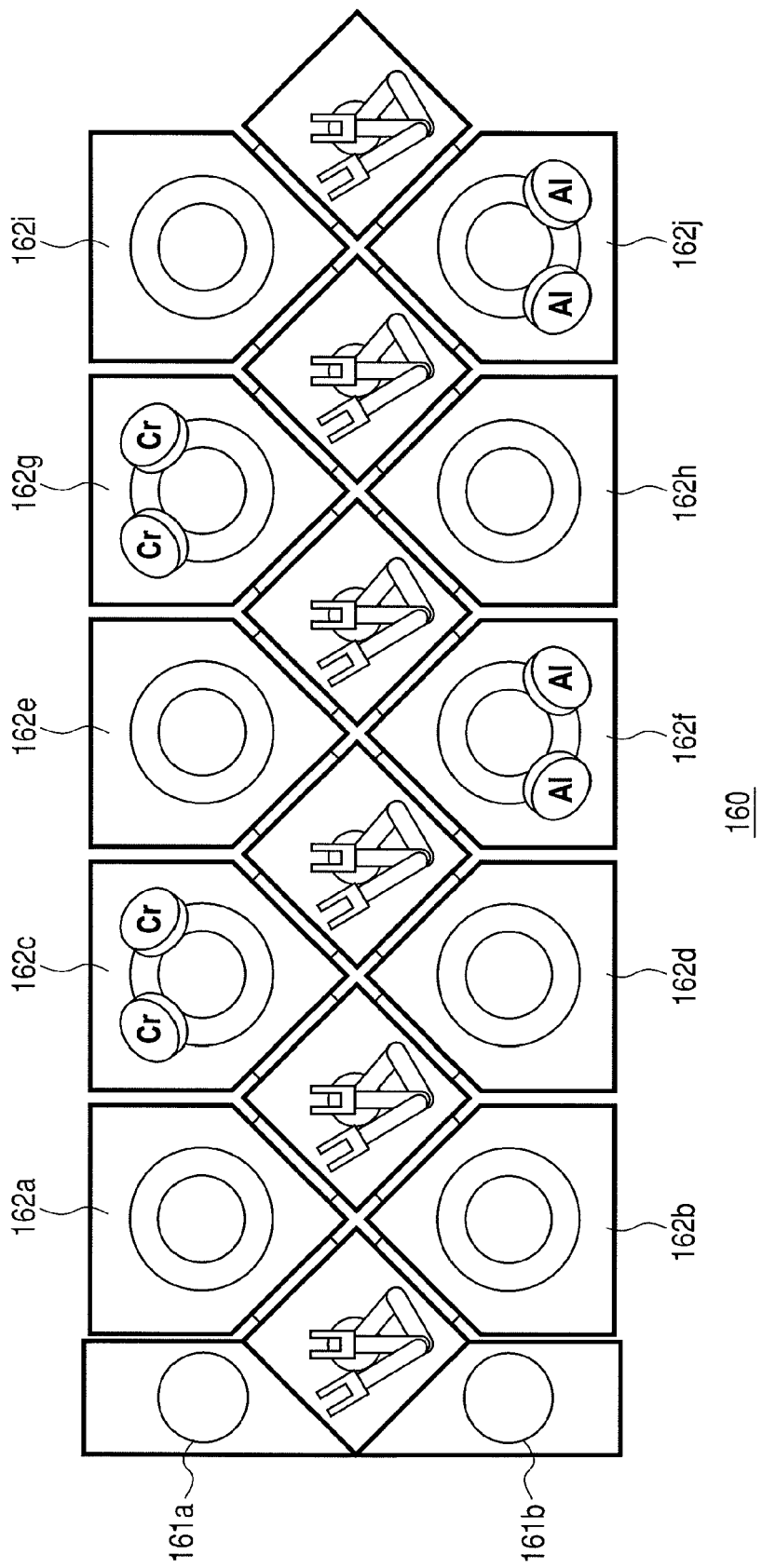
FIG. 16 is a diagram showing a case where an actual process is performed using an inline-type wafer conveyance device similar to that in FIG. 14.

FIG. 16 shows a case where an actual process is performed using an inline-type wafer conveyance device 160 similar to that in FIG. 14. A flow of procedure for forming a CrOx/AlOx laminated film, a CrOx single layer film, or an AlOx single layer film, which is an insulating film used in a semiconductor device, is supposed. A wafer having been subjected to degassing processing in a first process module 162a is conveyed to a third process module 162c and after a Cr film is formed on the wafer, a CrOx film is formed in an oxidation process in a fifth process module 162e. The formation of an AlOx film is also the same, that is, after an Al film is formed in a tenth process module 162j, an AlOx film is formed in an oxidation process in an eighth process module 162h. In accordance with a required film thickness, by preparing a plurality of sets (not shown schematically) of Cr film formation modules (162c, 162g) and oxidation modules (162e, 162i) as shown in FIG. 16, it is possible to form the CrOx film without return conveyance. Similarly, in accordance with a required film thickness, by preparing a plurality of sets (not shown schematically) of Al film formation modules (162j, 162f) and oxidation modules (162h, 162d); it is possible to form the AlOx film without return conveyance. After the formation of the desired CrOx/AlOx laminated film, the CrOx single layer film, or the AlOx single layer film is completed, annealing processing is performed in a second process module 162b.

In FIG. 16, the first process module 162a is a degas module, the fifth process module 162e, the ninth process module 162i, the eighth process module 162h and the fourth process module 162d are each an oxidation module, and the second process module 162b is an annealing module.

Figure 17:
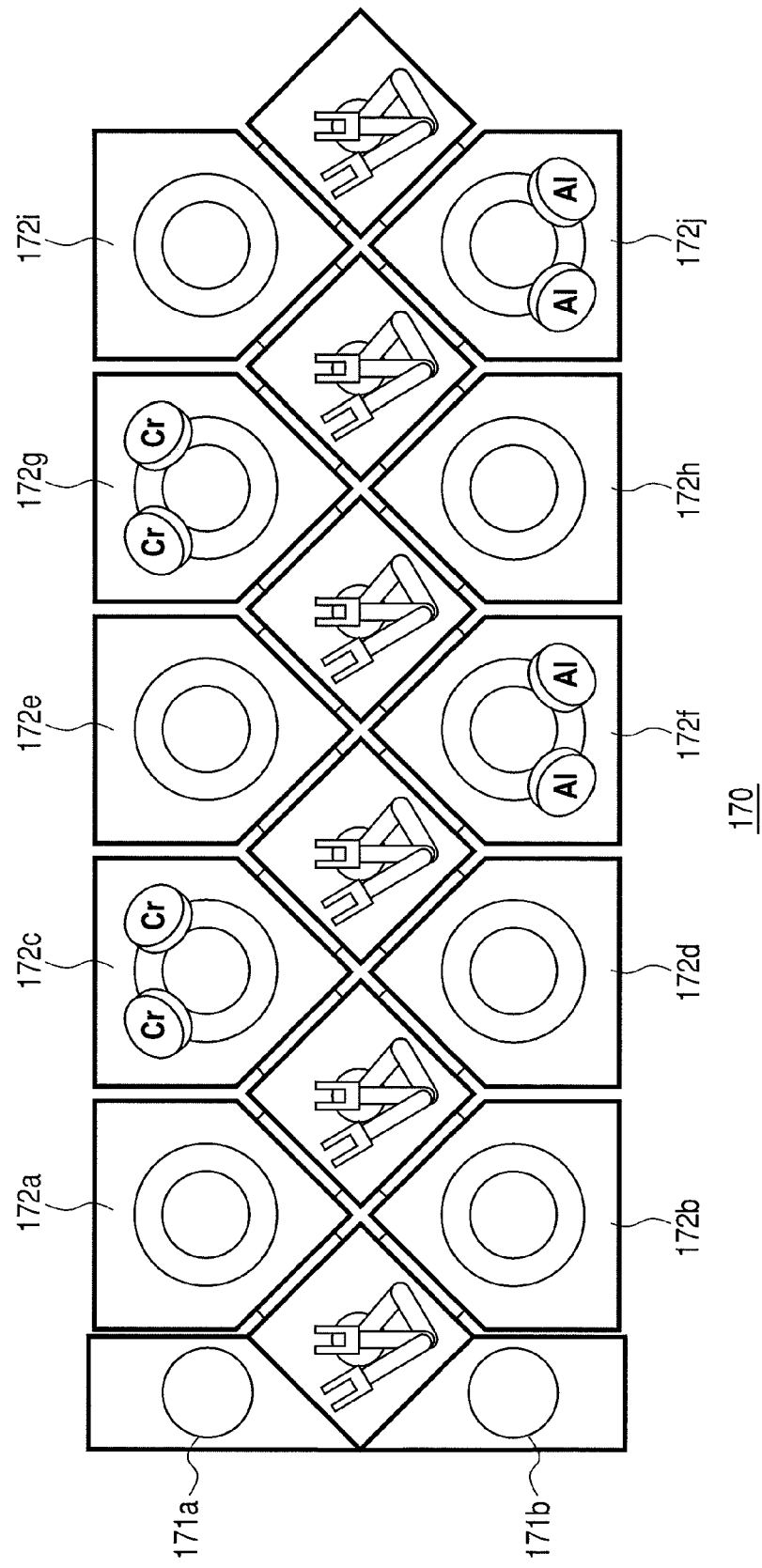
FIG. 17 is a diagram showing a case where an actual process is performed using an inline-type wafer conveyance device similar to that in FIG. 14.

FIG. 17 shows a case where an actual process is performed using an inline-type wafer conveyance device 170 similar to that in FIG. 14. A flow of procedure for forming a CrOx/AlOx laminated film, a CrOx single layer film, or an AlOx single layer film, which is an insulating film used in a semiconductor device, is supposed. A wafer having been subjected to degassing processing in a first process module 172a is conveyed to a third process module 172c and after a Cr film is formed on the wafer, a CrOx film is formed in an oxidation process in a fifth process module 172e. The formation of an AlOx film is the same, that is, after an Al film is formed in a tenth process module 172j, an AlOx film is formed in an oxidation process in an eighth process module 172h. In accordance with a required film thickness, a plurality of sets (not shown schematically) of Cr film formation modules (172c, 172g) and oxidation modules (172e, 172i) is prepared and film formation and oxidation are repeated by return conveyance. When a CrOx film having a thickness of 20 nm is formed, after a Cr film having a thickness of 1 nm is formed in the Cr film formation module, the Cr film is oxidized in the oxidation module to form a CrOx film having a thickness of 2 nm, and then this set of tasks is repeated ten times and thus a CrOx film having a thickness of 20 nm is formed. The formation of an AlOx film is the same. After the formation of the desired CrOx/AlOx laminated film, the CrOx single layer film, or the AlOx single layer film is completed, annealing processing is performed in a second process module 172b.

In FIG. 17 also, the first process module 172a is a degas module, the fifth process module 172e, the ninth process module 172i, the eighth process module 172h and a fourth process module 172d are each an oxidation module and the second process module 172b is an annealing module.

Figure 18:
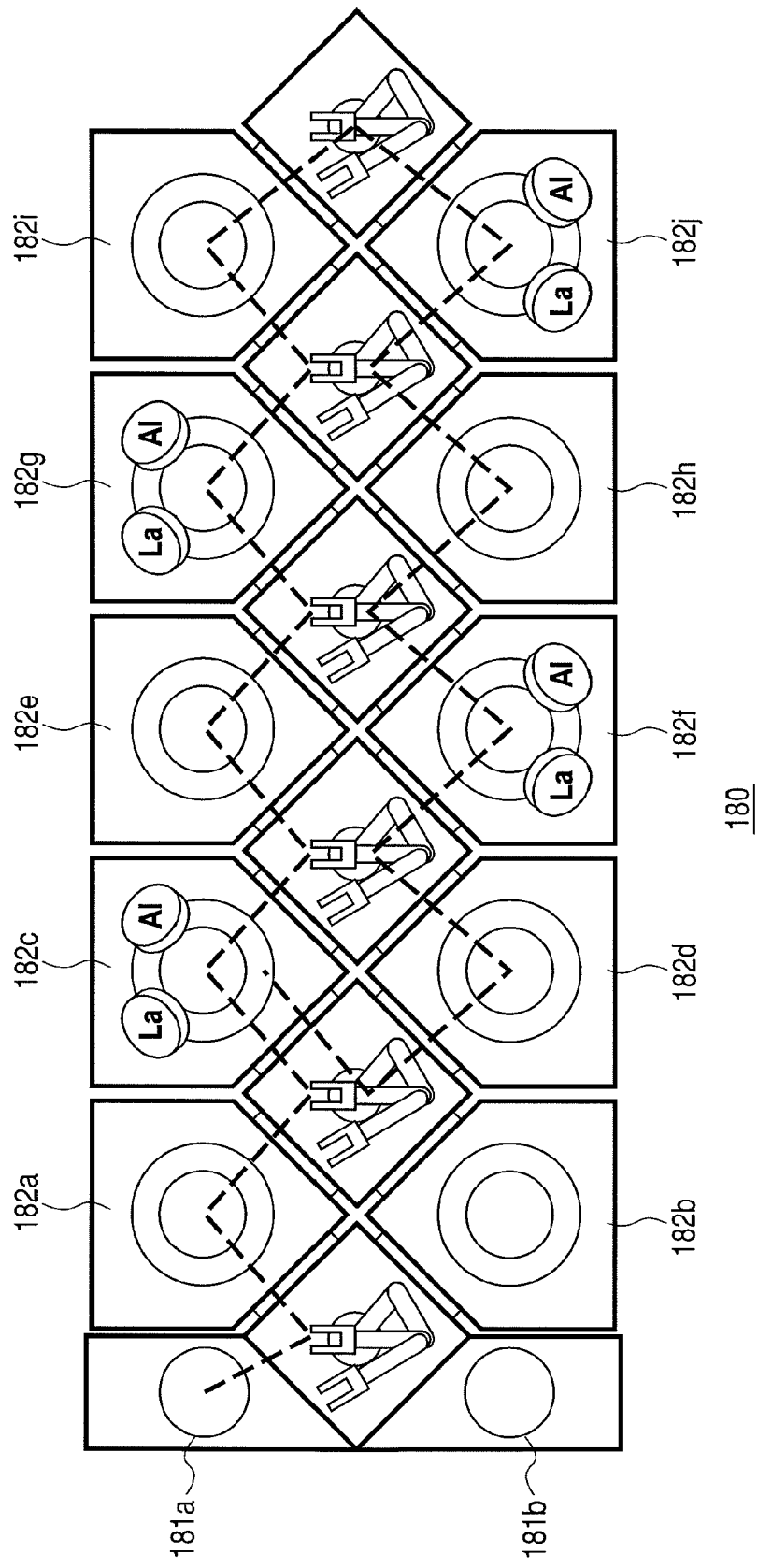
FIG. 18 is a diagram showing a case where an actual process is performed using an inline-type wafer conveyance device similar to that in FIG. 14.

FIG. 18 shows a case where an actual process is performed using an inline-type wafer conveyance device 180 similar to that in FIG. 14. A flow of procedure for forming an LaAlOx film, which is an insulating film used in a semiconductor device, is supposed. After an LaAl alloy film is formed by co-sputtering of La and Al in a third process module 182c, an LaAlOx film is formed in an oxidation process in a fifth process module 182e. Further, after a LaAl film is formed by co-sputtering of La and Al in a seventh process module 182g, a LaAlOx layer is formed in an oxidation process in a ninth process module 182i. Similarly, film formation (tenth process module 182j) and oxidation (eighth process module 182h), film formation (sixth process module 182f) and oxidation (fourth process module 182d) are repeated. In order to form a desired LaAlOx film, the above-mentioned set is repeated.

In FIG. 18 also, a first process module 182a is a degas module, the fifth process module 182e, the ninth process module 182i, the eighth process module 182h and the fourth process module 182d are each an oxidation module, and a second process module 182b is an annealing module.

Figure 19:
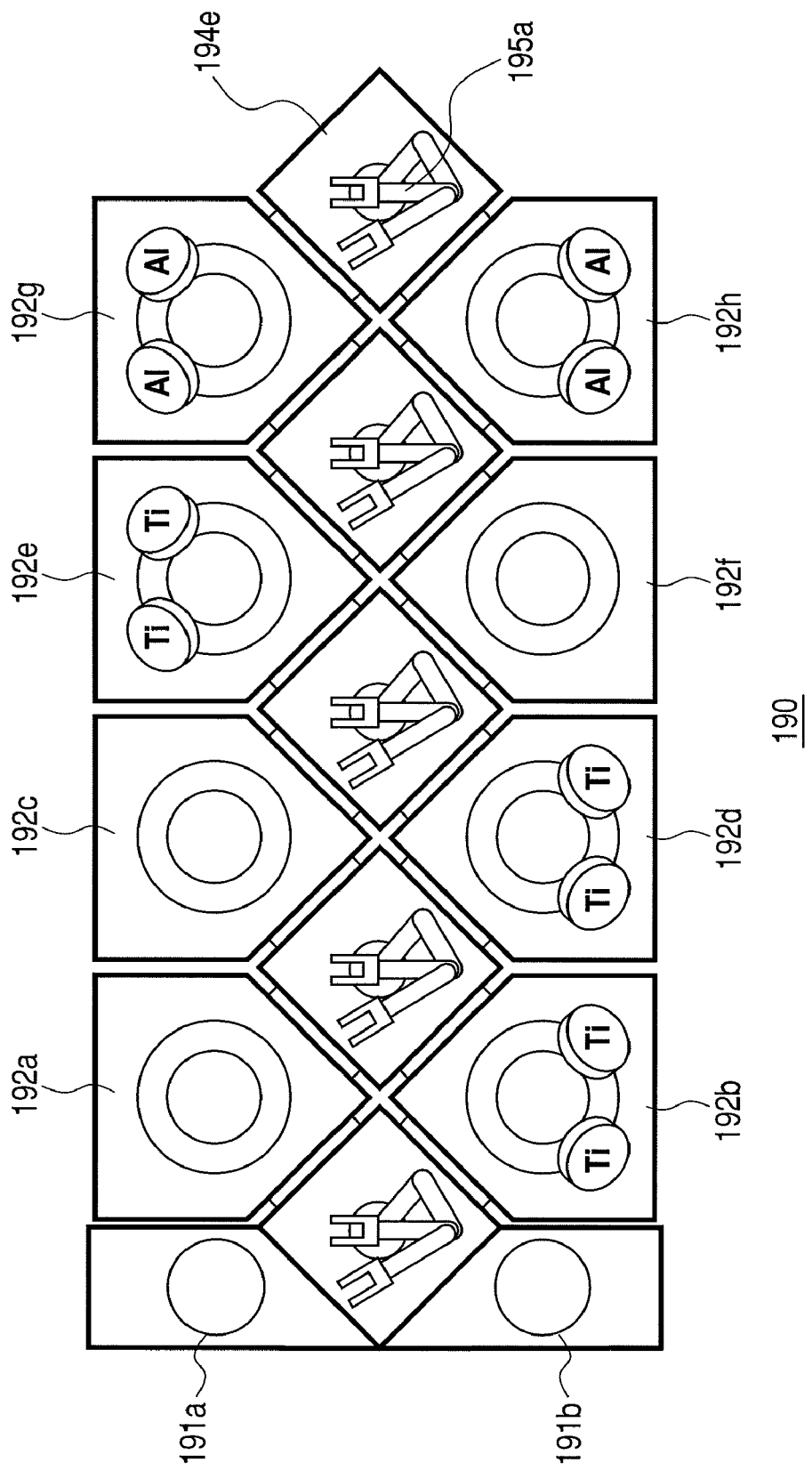
FIG. 19 is a diagram showing a case where an actual process is performed using an inline-type wafer conveyance device having the structure illustrated in FIG. 14 in which the number of process modules is eight and the number of intermediate conveyance chambers is three.

FIG. 19 shows a case where an actual process is performed using an inline-type wafer conveyance device 190 that has the same structure illustrated in FIG. 14 except in that the number of process modules is eight and the number of intermediate conveyance chambers is three. A flow of procedure for forming a wiring Al film including via whole embodiment used in a memory system device is supposed. The film structure is designed as, for example, Ti (20 nm)/TiN (60 nm)/Seed-Al (200 nm)/Fill-Al (450 nm)/TiN (100 nm). First, an unprocessed wafer is carried into a load chamber 191a from outside (atmosphere side) and the load chamber 191a is evacuated. Next, after the unprocessed wafer is carried into a first process module 192a, the wafer is subjected to degassing processing and pre-cleaning of the wafer surface is performed within a third process module 192c. Next, the wafer is carried into a fifth process module 192e, and a titanium film (for example, 20 nm) and a TiN film (for example, 60 nm) are formed sequentially. Next, the wafer is carried into a seventh process module 192g from the fifth process module 192e and a Seed-Al film (for example, 200 nm) is formed. Next, the wafer is carried into an eighth process module 192h from the seventh process module 192g using a conveyance mechanism 195a within an end conveyance chamber 194e and a Fill-Al film (for example, 450 nm) is formed. Next, the wafer is carried into a sixth process module 192f from the eighth process module 192h and after the above-mentioned wafer is cooled down, an ARC Cap film of TiN is formed in a fourth process module 192d or a second process module 192b and carried out from an unload chamber 191b to outside (atmosphere side). In FIG. 19, the Ti film having a thickness of 20 nm is formed in 192e and the Seed-Al film having a thickness of 200 nm is formed in 192g, however, by preparing the two process modules 192e, it is also possible to form a Ti film having a thickness of 10 nm in the first process module and form a Ti film having a thickness of 10 nm in the second process module, and then form a Ti film having a total thickness of 20 nm. For example, if the film formation in 192e requires two minutes and the film formation in 192g requires one minute, by preparing the two process modules 192e, it is possible to eliminate a wafer that waits for processing and the throughput can be increased as a result.

In FIG. 19, the first process module 192a is a degas module, the third process module 192c is a pre-cleaning module and the sixth process module 192f is a cooling module.

In the embodiments shown in FIGS. 10 to 19, each process module is shown to have a double arm structure, however, it is also possible for each process module to have a single arm structure.

Figure 20:
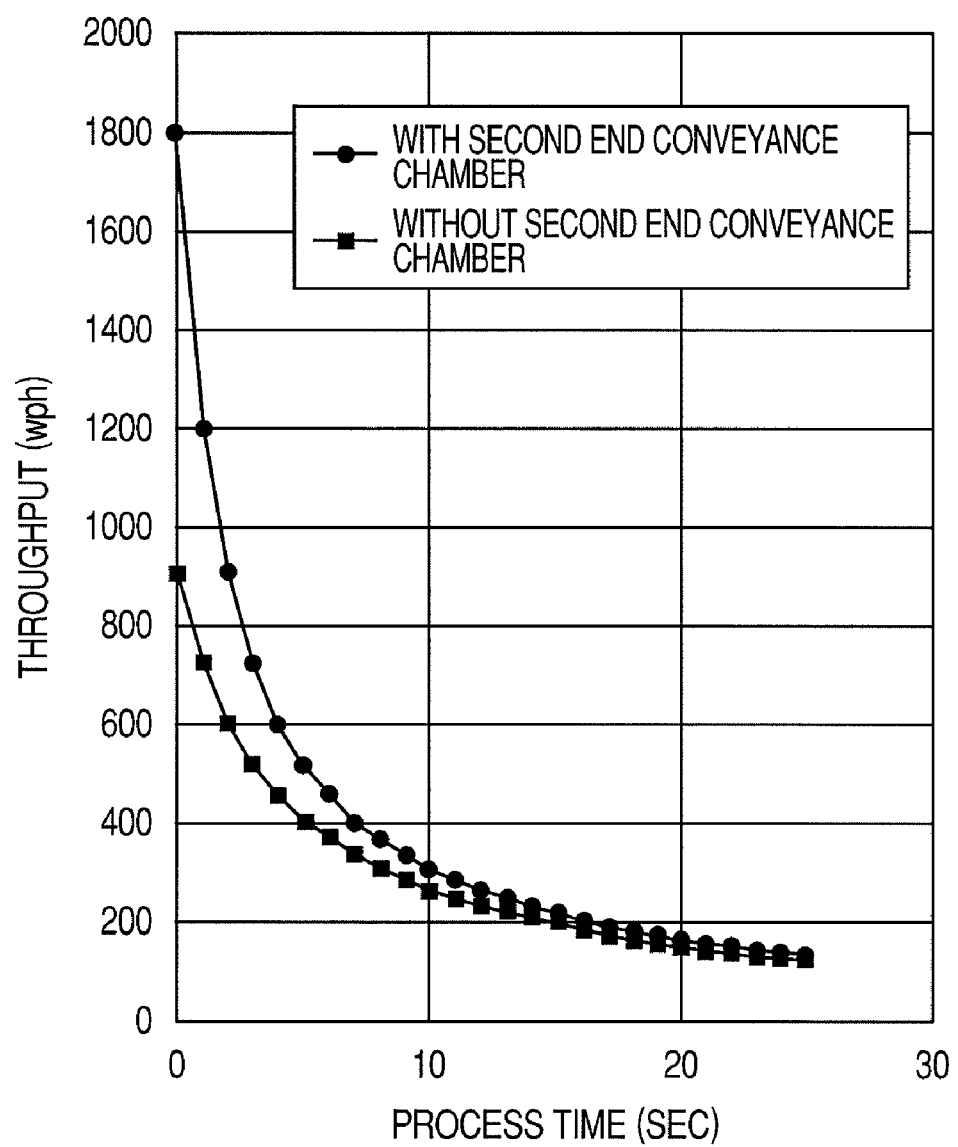
FIG. 20 is a graph showing a comparison of a relationship of throughput and processing time of a wafer conveyance device, between when the second end conveyance chamber is used as in the wafer conveyance device according to the present invention and when the second end conveyance chamber is not used.

Table 1 and FIG. 20 show a relationship between throughput and processing time of a wafer conveyance device when the second end conveyance chamber is used as in the wafer conveyance device of the present invention and when the second end conveyance chamber is not used. In Table 1, $n_P$ represents the number of process modules comprised by a wafer conveyance device, $t_P$ the processing time required by one process module, and $t_R$ the conveyance time required by one conveyance chamber to convey a wafer between process modules located ahead and behind. The maximum time in Table 1 is the maximum processing time in the processes in all of the process modules. The maximum time when the second end conveyance chamber is used is calculated as a sum of $t_P$ and $t_R$ and the maximum time when the second end conveyance chamber is not used as a sum of $t_P$ and twice $t_R$. "Wph (wafer per hour)" represents the number of wafers to be processed per hour.

Table 1 shows throughput when $n_P=6$ and $t_R=2$ are assumed, and the process time $t_P$ is set to various values when the second end conveyance chamber exists and when not. A graph in which the vertical axis represents throughput and the horizontal axis represents process time is shown in FIG. 20. When the process time is short, a difference between when the second end conveyance chamber exists and when not is remarkable and it can be seen that the wafer processing performance per unit time of a wafer conveyance device is increased by using the second end conveyance chamber as in the present invention.

TABLE 1

| $n_P$ | $t_P$ (sec) | $t_R$ (sec) | With 2nd end conveyance chamber | | Without 2nd end conveyance chamber | |
|---|---|---|---|---|---|---|
| | | | Max. time (sec) | Throughput (wph) | Max. time (sec) | Throughput (wph) |
| 6 | 0 | 2 | 2 | 1800.0 | 4 | 900.0 |
| 6 | 1 | 2 | 3 | 1200.0 | 5 | 720.0 |
| 6 | 2 | 2 | 4 | 900.0 | 6 | 600.0 |
| 6 | 3 | 2 | 5 | 720.0 | 7 | 514.3 |
| 6 | 4 | 2 | 6 | 600.0 | 8 | 450.0 |
| 6 | 5 | 2 | 7 | 514.3 | 9 | 400.0 |
| 6 | 6 | 2 | 8 | 450.0 | 10 | 360.0 |
| 6 | 7 | 2 | 9 | 400.0 | 11 | 327.3 |
| 6 | 8 | 2 | 10 | 360.0 | 12 | 300.0 |
| 6 | 9 | 2 | 11 | 327.3 | 13 | 276.9 |
| 6 | 10 | 2 | 12 | 300.0 | 14 | 257.1 |
| 6 | 11 | 2 | 13 | 276.9 | 15 | 240.0 |
| 6 | 12 | 2 | 14 | 257.1 | 16 | 225.0 |
| 6 | 13 | 2 | 15 | 240.0 | 17 | 211.8 |
| 6 | 14 | 2 | 16 | 225.0 | 18 | 200.0 |
| 6 | 15 | 2 | 17 | 211.8 | 19 | 189.5 |
| 6 | 16 | 2 | 18 | 200.0 | 20 | 180.0 |
| 6 | 17 | 2 | 19 | 189.5 | 21 | 171.4 |
| 6 | 18 | 2 | 20 | 180.0 | 22 | 163.6 |
| 6 | 19 | 2 | 21 | 171.4 | 23 | 156.5 |
| 6 | 20 | 2 | 22 | 163.6 | 24 | 150.0 |
| 6 | 21 | 2 | 23 | 156.5 | 25 | 144.0 |
| 6 | 22 | 2 | 24 | 150.0 | 26 | 138.5 |
| 6 | 23 | 2 | 25 | 144.0 | 27 | 133.3 |
| 6 | 24 | 2 | 26 | 138.5 | 28 | 128.6 |
| 6 | 25 | 2 | 27 | 133.3 | 29 | 124.1 |

$n_P$ = Number of process modules
$t_P$ = Process time
$t_R$ = Conveyance time

What is claimed is:

1. An inline-type wafer conveyance device comprising:
a load lock chamber for carrying in an unprocessed wafer from outside and carrying out a processed wafer to the outside;
a first end conveyance chamber connected to the load lock chamber;
at least one intermediate conveyance chamber;
a plurality of sets of a pair of process modules provided adjacent to each other and capable of independent processing, each set of process modules comprising a pair of process modules; and
a second end conveyance chamber located at the end part of the inline-type wafer conveyance device, the end part being the opposite side to the load lock chamber,
wherein a set of process modules is arranged one by one between the first end conveyance chamber and an intermediate conveyance chamber, between intermediate conveyance chambers when more than one intermediate conveyance chamber are provided, and between an intermediate conveyance chamber and the second end conveyance chamber, respectively.

2. An inline-type wafer conveyance device according to claim 1, wherein the first end conveyance chamber, the intermediate conveyance chamber, and the second end conveyance chamber each have a conveyance mechanism capable of simultaneously conveying at least two wafers.

3. An inline-type wafer conveyance device according to claim 1, wherein:
the first end conveyance chamber and the second end conveyance chamber each have at least one conveyance mechanism and at least first and second side surfaces perpendicular to each other;
each of the intermediate conveyance chambers has at least one conveyance mechanism, substantially a square plane shape, and four side surfaces;
each of the process modules has at least first and second side surfaces perpendicular to each other;
the first and second side surfaces of the first end conveyance chamber are connected to the first side surface of one of the process modules constituting the first set of process modules and to the first side surface of the other process module, respectively;
the first and second side surfaces of each intermediate conveyance chamber are connected to the second side surface of one of the process modules of the set of process modules located immediately ahead and to the second side surface of the other process module, respectively, and the third and fourth side surfaces of each intermediate conveyance chamber are connected to the first side surface of one of the process modules of the set of process modules located immediately behind and to the first side surface of the other process module, respectively;
the first and second side surfaces of the second end conveyance chamber are connected to the second side surface of one of the process modules of the set of process modules located immediately ahead and to the second side surface of the other process module, respectively; and
the second end conveyance chamber is located at the end part of the inline-type wafer conveyance device.

4. An inline-type wafer conveyance device according to claim 3, wherein:
the first and second side surfaces of the first end conveyance chamber, the first to fourth side surfaces of the intermediate conveyance chamber, the first and second side surfaces of the second end conveyance chamber, and the first and second side surfaces of the process module each include a horizontal slit to let a wafer pass; and
the process module has a stage for placing a wafer.

5. An inline-type wafer conveyance device according to claim 1, wherein:
each of the first end conveyance chamber and the second end conveyance chamber has at least one conveyance mechanism and each of the intermediate conveyance chambers has at least one conveyance mechanism; and
the pair of process modules belonging to each of the sets of process modules is connected to one of neighboring conveyance chambers via one of two gate valves the directions of which are perpendicular to each other and to the other neighboring conveyance chamber via the other gate valve.

6. An inline-type wafer conveyance device according to claim 1, wherein when the total number of the first end conveyance chamber, the intermediate conveyance chambers and the second end conveyance chamber is m, the number of the process modules n is expressed as n=2 (m−1) at the maximum.

7. An inline-type wafer conveyance device according to claim 1, wherein the load lock chamber, the first end conveyance chamber, the intermediate conveyance chamber, the process module and the second end conveyance chamber are connected via gate valves.

8. An inline-type wafer conveyance device according to claim 3, wherein:
the load lock chamber includes a conveyance mechanism and first and second buffer chambers; and
the first end conveyance chamber has substantially a square plane shape and four side surfaces, and the third and fourth side surfaces of the first end conveyance chamber are connected to the first and second buffer chambers, respectively.

9. An inline-type wafer conveyance device according to claim 5, wherein:
the load lock chamber includes a conveyance mechanism and first and second buffer chambers; and
the first end conveyance chamber is connected to the first and second buffer chambers, respectively.

10. An inline-type wafer conveyance device according to claim 8, wherein:
an unprocessed wafer is carried into one of the process modules connected to the first end conveyance chamber from the first buffer chamber by the conveyance mechanism of the first end conveyance chamber; and
a processed wafer is carried out to the second buffer chamber from the other process module connected to the first end conveyance chamber by the conveyance mechanism of the first end conveyance chamber.

11. An inline-type wafer conveyance device according to claim 8, wherein a space is provided between the first buffer chamber and the second buffer chamber.

12. An inline-type wafer conveyance device according to claim 1, wherein:
the number of the process modules is six; and
the conveyance time required for the one conveyance chamber to convey a wafer between the process modules located ahead and behind is two seconds and the maximum process time in each process module is ten seconds or less.

13. An inline-type wafer conveyance device according to claim 9, wherein:
an unprocessed wafer is carried into one of the process modules connected to the first end conveyance chamber from the first buffer chamber by the conveyance mechanism of the first end conveyance chamber; and
a processed wafer is carried out to the second buffer chamber from the other process module connected to the first end conveyance chamber by the conveyance mechanism of the first end conveyance chamber.

14. An inline-type wafer conveyance device according to claim 9, wherein a space is provided between the first buffer chamber and the second buffer chamber.

15. An inline-type wafer conveyance device according to claim 10, wherein a space is provided between the first buffer chamber and the second buffer chamber.

* * * * *